(12) United States Patent
Torii et al.

(10) Patent No.: US 8,954,828 B2
(45) Date of Patent: Feb. 10, 2015

(54) MEMORY CONTROLLER

(71) Applicant: Kabushiki Kaisha Toshiba, Minato-ku (JP)

(72) Inventors: Osamu Torii, Tokyo (JP); Shinichi Kanno, Tokyo (JP); Ryo Yamaki, Kanagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 108 days.

(21) Appl. No.: 13/841,923

(22) Filed: Mar. 15, 2013

(65) Prior Publication Data

US 2013/0246887 A1    Sep. 19, 2013

(30) Foreign Application Priority Data

Mar. 19, 2012  (JP) ................................. 2012-061692
Aug. 28, 2012  (JP) ................................ 2012-187140

(51) Int. Cl.
  *H03M 13/00*   (2006.01)
  *H03M 13/09*   (2006.01)
  *H03M 13/15*   (2006.01)
  *H03M 13/29*   (2006.01)

(52) U.S. Cl.
  CPC ............ *H03M 13/09* (2013.01); *H03M 13/152* (2013.01); *H03M 13/2906* (2013.01)
  USPC ............ 714/784; 714/755; 714/758; 714/785

(58) Field of Classification Search
  CPC ....................................................... H03M 13/09
  USPC .................................. 714/758, 781, 784, 785
  See application file for complete search history.

(56) References Cited

U.S. PATENT DOCUMENTS

| 4,525,838 | A | 6/1985 | Patel |
| 4,996,690 | A * | 2/1991 | George et al. ................. 714/781 |
| 7,210,077 | B2 | 4/2007 | Brandenberger et al. |
| 7,231,585 | B2 * | 6/2007 | Vainsencher et al. ......... 714/784 |
| 7,418,644 | B2 | 8/2008 | Smith et al. |
| 7,795,689 | B2 | 9/2010 | Kawakita |
| 7,851,914 | B2 | 12/2010 | Masukawa et al. |
| 8,168,759 | B2 * | 5/2012 | McKinnon et al. ........ 530/387.3 |

(Continued)

FOREIGN PATENT DOCUMENTS

| JP | 63-54254 | 10/1988 |
| JP | 9-8672 | 1/1997 |

(Continued)

OTHER PUBLICATIONS

U.S. Appl. No. 14/193,166, filed Feb. 28, 2014, Kokubun, et al.

(Continued)

*Primary Examiner* — Esaw Abraham
(74) *Attorney, Agent, or Firm* — Oblon, Spivak, McClelland, Maier & Neustadt, L.L.P.

(57) ABSTRACT

According to an embodiment, a memory controller includes: a coding unit that performs an error correction coding process for user data to generate first to n-th parities and performs the error correction coding process for each of the first to n-th parities to generate first to n-th external parities; and a decoding unit that performs an error correction decoding process using the user data, the first to n-th parities, and the first to n-th external parities. A generator polynomial used to generate an i-th parity is selected on the basis of a generator polynomial used to generate the first to (i−1)-th parities.

20 Claims, 24 Drawing Sheets

(56) References Cited

U.S. PATENT DOCUMENTS

| | | |
|---|---|---|
| 8,169,824 B2 | 5/2012 | Endo et al. |
| 8,225,185 B1 * | 7/2012 | Tang et al. .................... 714/784 |
| 8,301,986 B2 * | 10/2012 | Jo et al. ........................ 714/785 |
| 8,607,128 B2 * | 12/2013 | Weingarten et al. .......... 714/780 |
| 8,645,789 B2 | 2/2014 | Sharon et al. |
| 8,667,369 B2 * | 3/2014 | Kong et al. .................... 714/763 |
| 8,677,213 B2 * | 3/2014 | Mizushima .................... 714/763 |
| 2005/0028067 A1 | 2/2005 | Weirauch |
| 2007/0250753 A1 | 10/2007 | Bresalier et al. |
| 2010/0258873 A1 | 10/2010 | Harashima et al. |
| 2010/0313099 A1 | 12/2010 | Yamaga |
| 2011/0289385 A1 | 11/2011 | Takeuchi et al. |
| 2012/0260147 A1 | 10/2012 | Perlmutter et al. |
| 2013/0166988 A1 | 6/2013 | Sharon et al. |

FOREIGN PATENT DOCUMENTS

| | | |
|---|---|---|
| JP | 2591611 | 3/1997 |
| JP | 2005-56397 | 3/2005 |
| JP | 2005-129596 | 5/2005 |
| JP | 2005-216301 | 8/2005 |
| JP | 2008-028324 | 2/2008 |
| JP | 2009-211209 | 9/2009 |
| JP | 2009-259975 | 11/2009 |
| JP | 2010-182939 | 8/2010 |
| JP | 2010-245454 | 10/2010 |

OTHER PUBLICATIONS

Office Action issued Sep. 22, 2014 in co-pending U.S. Appl. No. 13/724,337.

* cited by examiner

|  | EXTERNAL PARITY | PARITY #1 | PARITY #2 | PARITY #3 | ... | PARITY #n |
|---|---|---|---|---|---|---|
| PARITY #1 | × | - | ○ | ○ | ... | ○ |
| PARITY #2 | ○ | - | - | × | ... | × |
| PARITY #3 | ○ | - | - | - | ... | × |
| ... | ... | ... | ... | ... | ... | ... |
| PARITY #n | ○ | - | - | - | ... | - |

MEMORY CONTROLLER

CROSS-REFERENCE TO RELATED APPLICATIONS

This application is based upon and claims the benefit of priority from the prior Japanese Patent Application No. 2012-061692, filed on Mar. 19, 2012, and Japanese Patent Application No. 2012-187140, filed on Aug. 28, 2012; the entire contents of which are incorporated herein by reference.

FIELD

Embodiments described herein generally relate to a memory controller, a memory device, and an error correction method.

BACKGROUND

For example, when user data stored in a memory is read from the memory, the original value is changed to a different value, or when a receiving device receives data transmitted from a transmitting device, the received data is changed to a value different from the original value.

In order to solve this problem, error correcting code is generally used. Examples of the error correcting code include a BCH code and an RS (Reed-Solomon) code.

DETAILED DESCRIPTION

According to an embodiment, a memory controller includes: a coding unit that encodes user data to generate first to n-th parities and performs the error correction coding process for each of the first to n-th parities to generate first to n-th external parities; and a decoding unit that performs an error correction decoding process using the user data, the first to n-th parities, and the first to n-th external parities. A generator polynomial used to generate an i-th parity (i is an integer equal to or greater than 1 and equal to or less than n) is selected on the basis of a generator polynomial used to generate the first to (i−1)-th parities.

Hereinafter, a memory controller, a memory device, and an error correction method according to embodiments of the invention will be described in detail with reference to the accompanying drawings. The invention is not limited by the embodiments.

First Embodiment

Figure 1:
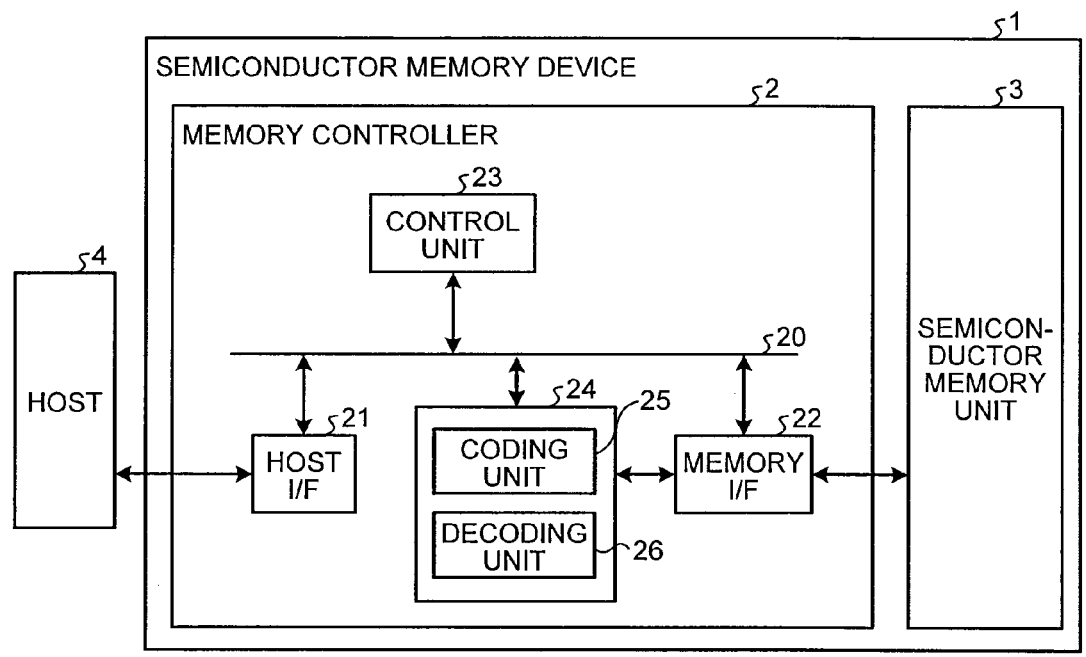
FIG. 1 is a block diagram illustrating an example of the structure of a memory system according to a first embodiment.

FIG. 1 is a block diagram illustrating an example of the structure of a memory system according to a first embodiment. A semiconductor memory device (memory device) 1 according to this embodiment includes a memory controller 2 and a semiconductor memory unit (non-volatile memory) 3. The memory device 1 can be connected to a host 4. FIG. 1 illustrates a state in which the memory device 1 is connected to the host 4. The host 4 is an electronic apparatus, such as a personal computer or a portable terminal.

The semiconductor memory unit 3 is a non-volatile memory which stores data in a non-volatile manner and is, for example, a NAND memory. In this embodiment, an example in which a NAND memory is used as the semiconductor memory unit 3 will be described, but storage units other than the NAND memory may be used as the semiconductor memory unit 3. There is the unit of writing (the minimum unit of writing), which is generally called a page, in the NAND memory and data is written in a page unit.

The memory controller 2 controls the writing of data to the semiconductor memory unit 3 in response to a write command (request) from the host 4 and controls the reading of data from the NAND memory 3 in response to a read command (request) from the host 4. The memory controller 2 includes a host I/F 21, a memory I/F 22, a control unit 23, and a coding/decoding unit 24. The coding/decoding unit 24 includes a coding unit 25 and a decoding unit 26. The host I/F 21, the memory I/F 22, the control unit 23, the coding unit 25, and the decoding unit 26 are connected to an internal bus 20.

The host I/F 21 performs a process according to the interface standard with the host 4 and outputs, for example, commands and user data received from the host 4 to the internal bus 20. In addition, the host I/F 21 transmits, for example, the user data read from the semiconductor memory unit 3 and a response transmitted from the control unit 23 to the host 4.

The memory I/F 22 controls a process of writing write data to the semiconductor memory unit 3 and a process of reading data from the semiconductor memory unit 3 based on instructions from the control unit 23.

The control unit 23 is a control unit that controls the overall operation of each component of the semiconductor memory device 1. When receiving a command from the host 4 through the host I/F 21, the control unit 23 performs control corresponding to the command. For example, the control unit 23 instructs the memory I/F 22 to write the user data and parities to the semiconductor memory unit 3 or to read the user data from the semiconductor memory unit 3, in response to the command from the host 4.

The coding unit 25 encodes to generate parities based on data transmitted from the internal bus 20. Any code may be used as an error correction code. For example, a BCH code or an RS (Reed-Solomon) code may be used. In the following description, for example, the BCH code is used, but the kind of error correction code is not limited thereto. It is preferable to use a code which can be separated into information data and parities after coding.

The decoding unit 26 performs a decoding process based on the user data and parities read from the semiconductor memory unit 3. When there is no error in the user data, the decoding unit 26 outputs the user data read from the semiconductor memory unit 3 to the internal bus 20 without being processed. When there is an error in the user data, the decoding unit 26 corrects the error using the parities and outputs the corrected user data to the internal bus 20.

Data is written to the NAND memory in a page unit. In some cases, there are pages with different reliabilities (probabilities of the error occurring). For example, when a multi-valued cell is used as a memory cell of the NAND memory, generally, different pages are allocated to each bit which is stored in one memory cell. For example, when three bits are stored in one memory cell, different pages are allocated to three bits. In this case, the pages have different reliabilities.

In the page with low reliability, it is preferable that a parity with high error correction capability be generated. The size of parity increases in order to implement the parity with high error correction capability. The pages of the NAND memory have the same size. Therefore, in order to generate a parity with error correction capability corresponding to the page with low reliability, for example, the following method is considered: the parity of the page with low reliability is divided into two parts and one part is stored the page with high reliability. However, in the method, when the user data is read from the page with low reliability, it is necessary to read other pages in which the divided parity is stored, which results in a reduction in the reading speed. In addition, in practice, in many cases, in most of the pages with low reliability, there is no error or the number of errors is less than an assumed maximum value and error correction capability corresponding to the page with high reliability is sufficient.

Figure 2:
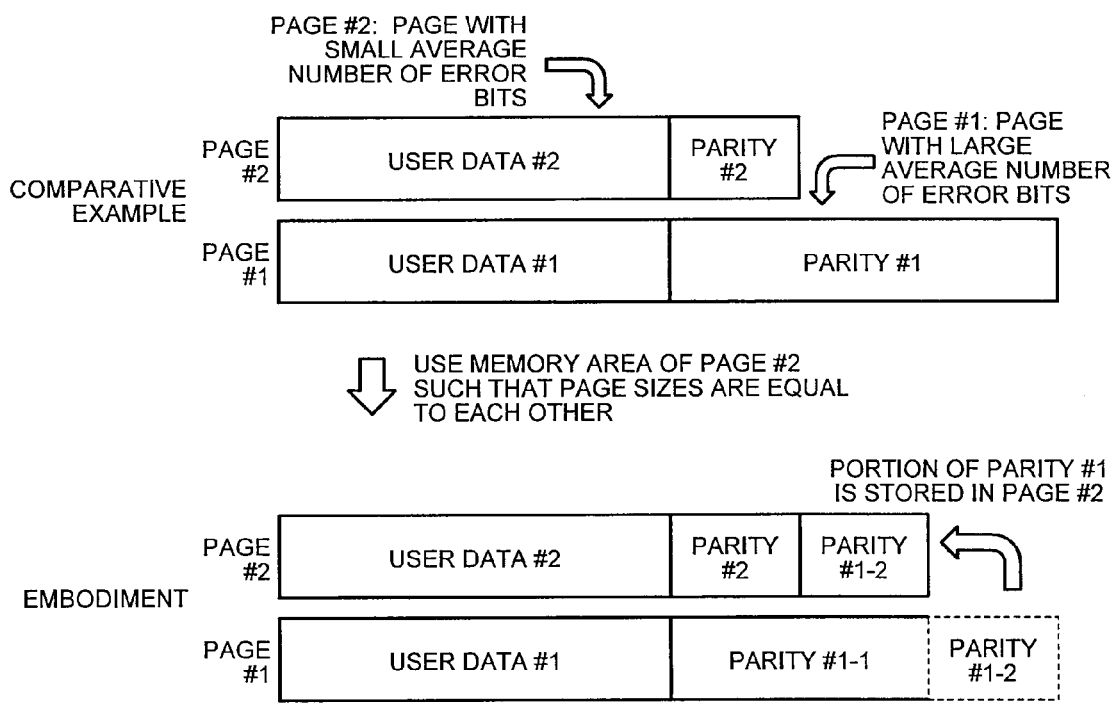
FIG. 2 is a diagram illustrating an example of the storage concept of parities according to the first embodiment.

In this embodiment, a error correction code has multiple parities and is capable to change a number of parities that used in the error correction according to error rate. By using the error correction code, the more parities used in the error correction, the more errors can be corrected. FIG. 2 is a diagram illustrating an example of the concept of the storage of parity in this embodiment. The upper part of FIG. 2 illustrates, as a comparative example, an example in which parity #1 with high error correction capability is generated for user data #1 of a page with low reliability, parity #2 with low error correction capability is generated for user data #2 of a page with high reliability, and they are stored. As such, when the parity with error correction capability which is changed depending on the level of reliability is generated and stored in the same page as that in which the user data is stored, the pages have different parity sizes.

In contrast, in this embodiment illustrated in the lower part of FIG. 2, parity #1 with high error correction capability is not generated in one stage, but is generated in stages as follows: parity #1-1 with predetermined error correction capability is generated based on user data #1 in the first stage, parity #1-2 is generated using user data #1 and parity #1-1 in the second stage, and parity #1-3 is generated using user data #1, parity #1-1, and parity #1-2 in the third stage Decoding is performed in stages as follows: when error correction using parity #1-1 failed, parity #1-2 is read; and when error correction in which decoding is performed using parity #1-1 and parity #1-2 is unavailable, parity #1-3 is read During the coding and decoding, for example, as illustrated in FIG. 2, when user data #1 is stored in page #1 with low reliability (more than the average number of error bits), parity #1-1 which is generated based on user data #1 can be stored in the page in which user data #1 corresponding to the parity is stored and parity #1-2 can be stored in page #2 with high reliability. In general, during decoding, first, user data #1 and parity #1-1 are read. In this structure, when error correction can be performed by decoding using parity #1-1, a page (page #2 in the example illustrated in FIG. 2) other than page #1 may not be read. In FIG. 2, for simplicity of illustration, two-stage parities are described as an example. However, in this embodiment, the generation of the parity is not limited to two stages, but the parity may be generated in any stage.

As a method of generating the parity in multiple stages, a method is considered in which independent coding processes are performed in stages. For example, in the first stage, a parity A with predetermined error correction capability is generated for the user data. In the second stage, it is considered that a parity B with an error correction capability higher than the predetermined error correction capability is generated by another coding process based on the user data, the parity A is stored in the same page as that in which the user data is stored, similarly to FIG. 2, and the parity B is stored in a different page. However, in this case, since the parity B and the parity A are independently generated, it is impossible to utilize the error correction capability of the parity A during decoding using the parity B. However, when the proposed code is used, it is possible to utilize the error correction capability of parity #1-1 during decoding using parity #1-2. Therefore, when a total parity size is the same, the code to which a parity corresponding to an increase in error correction capability is added has high error correction capability as compared to coding in independent multiple stages. In addition, when error correction capability is the same, the code to which a parity corresponding to an increase in error correction capability is added has a small parity size.

Therefore, in this embodiment, the parity is generated in n stages such that the size of the parity in an i-th (i is an integer equal to or more than 2 and equal to or less than n) stage is less than the size of the parity which is independently generated so as to have the same error correction capability as that when error correction is performed for all parities in the first to i-th stages. For example, in the above-mentioned example, in this embodiment, the size of parity #1-2, which is the second-stage parity, is less than the size of the parity B which is the second-stage parity generated independently from the parity A.

Figure 3:
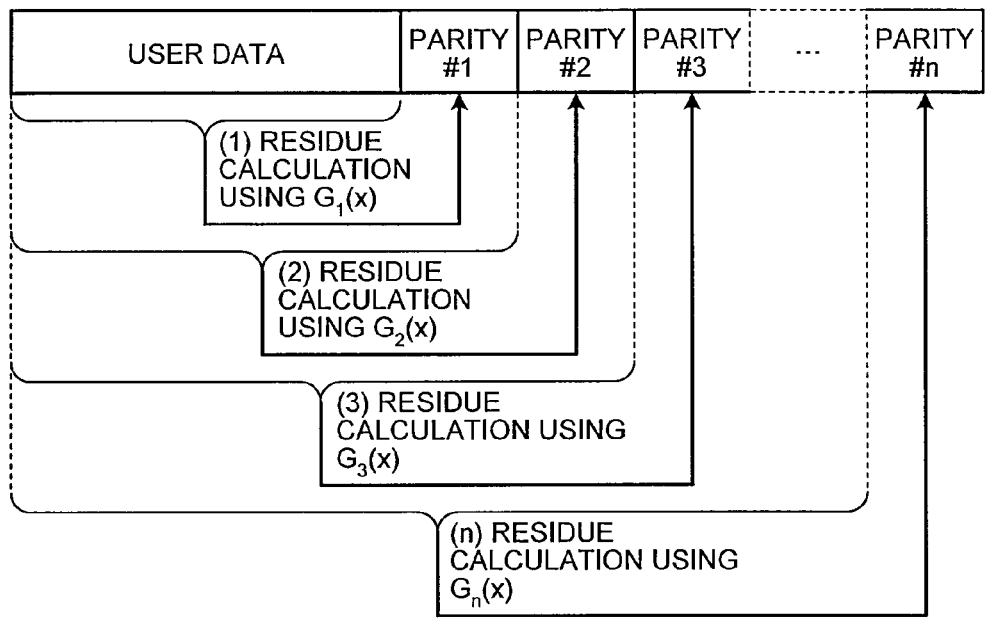
FIG. 3 is a diagram illustrating the concept of a coding operation according to the first embodiment.

Hereinafter, an error correction coding process (hereinafter, abbreviated to a coding operation) and a decoding operation according to this embodiment will be described. FIG. 3 is a diagram illustrating the concept of coding operation according to this embodiment. As illustrated in FIG. 3, the coding unit 25 according to this embodiment calculates parity in n stages as the coding operation as follows:

(1) Calculate parity #1 with $G_1(x)$ using the user data;
(2) Calculate parity #2 with $G_2(x)$ using the user data+parity #1;
(3) Calculate parity #3 with $G_3(x)$ using the user data+parity #1+parity #2; . . .
(n) Calculate parity #n (n is an integer equal to or greater than 1) with $G_n(x)$ using the user data+parity #1+parity #2+ . . . +parity #(n−1) (where $G_i(x)$ (i=1, 2, . . . , n) is a generator polynomial). $G_i(x)$ will be described in detail below. The error correction capability of parity means correctable error bit number included in the parity and the user data for which the parity is generated. For example, if the correctable error bit number of parity #1 is n bits, parity #1 is capable of correcting n error bits included in the user data and parity #1 in FIG. 3. Also if the correctable error bit number of parity #2 is m bits, parity #2 is capable of correcting m error bits included in the user data, parity #1 and party #2 in FIG. 3.

Figure 4:
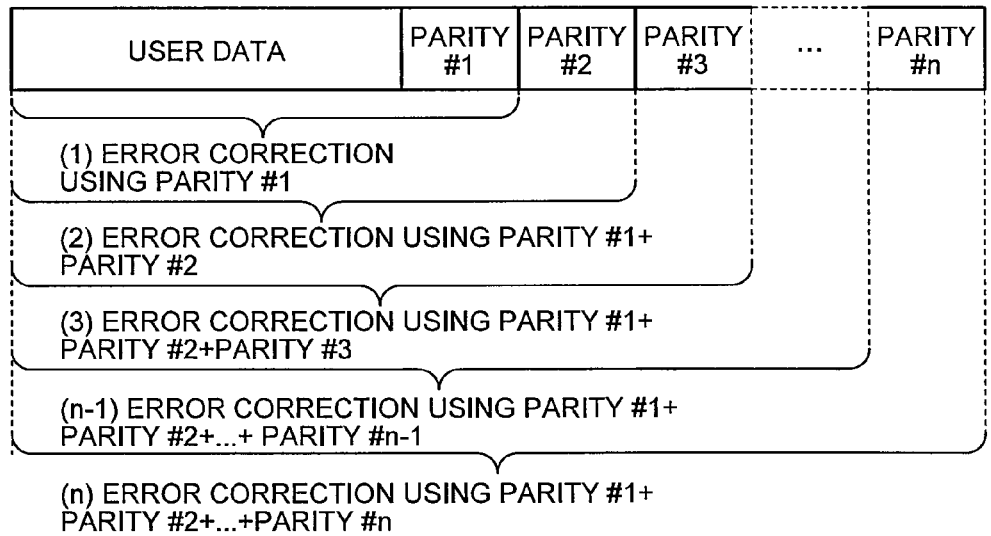
FIG. 4 is a diagram illustrating the concept of a decoding operation according to the first embodiment.

FIG. 4 is a diagram illustrating the concept of the decoding operation according to this embodiment. As illustrated in FIG. 4, the decoding unit 26 according to this embodiment performs error correction in n stages as the decoding operation as follows:

(1) Perform error correction for the user data+parity #1 using parity #1;
(2) Perform error correction for the user data+parity #1+parity #2 using parity #1 and parity #2 when error correction in (1) fails;
(3) Perform error correction for the user data+parity #1+parity #2+parity #3 using parity #1 to parity #3 when error correction in (2) fails; . . .
(n) Perform error correction for the user data+parity #1+parity #2+parity #3+ . . . +parity #n using parity #1 to parity #n when error correction in (n−1) fails.

In each stage, when error correction fails, the decoding operation proceeds to the next stage. In each stage, when error correction succeeds, the decoding operation does not proceed to the next stage, but ends. When error correction fails in the error correction process in the n-th stage, the decoding unit 26 notifies the control unit 23 that error correction has failed. The control unit 23 performs a predetermined process (for example, a process of notifying the host 4 that there is an error in the read user data) when error correction fails.

When the decoding process is performed for user data+parity #1 using parity #1 and there is no error in the user data, error correction is not performed for the user data, and the read user data is output without being processed. In addition, an error detection code may be added to the user data and it may be determined whether there is an error in the user data based on the error detection code.

When the above-mentioned operation is performed, in this embodiment, for example, the following coding operation is performed such that error correction using parity #1 to parity #(i+1) has a higher error correction capability than error correction using parity #1 to parity #i.

In the following description, a coding method and a decoding method using the BCH code will be described, but the code used in the coding method and the decoding method is not limited to the BCH code.

First, the BCH code will be generally described. For example, the user data, the parity, or a code word is a string of values of 0 or 1 and is represented by various methods. In this embodiment, polynomial representation is used to describe them. For example, user data 10101 can be represented by a user data polynomial $x^4+x^2+1$ according to polynomial representation.

During the coding operation, four arithmetic operations using a polynomial which is called a generating generator are performed for the user data polynomial to calculate a parity polynomial which is a parity polynomial representation. Then, the user data polynomial and the parity polynomial are combined to calculate a code polynomial.

The four arithmetic operations are performed based on a Galois field GF(2), a Galois extension field $GF(2^m)$, a primitive polynomial, and a minimum polynomial whose description will not be provided.

The Galois extension field $GF(2^m)$ has $2^m$ kinds of members, which are represented by 0, 1, α, $α^2$, $α^3$, . . . , $α^{M-1}$, $α^M$ ($M=2^m-2$).

When a polynomial (to which various kinds of stress is applied over time) obtained by adding an error to the code polynomial which is calculated using the generator polynomial is a reception polynomial, an error polynomial can be calculated based on the reception polynomial and a code polynomial can be calculated using the error polynomial. Therefore, it is necessary to appropriately select the generator polynomial.

Specifically, since a t-bit error can be calculated, the generator polynomial=0 may have 2t roots, that is, $α^r$, $α^{r+1}$, $α^{r+2}$, . . . , $α^{2t+r-2}$, and $α^{2t+r-1}$ (where r is an arbitrary integer (BCH bound)).

Next, a method of selecting the generator polynomial according to this embodiment based on the BCH code will be described. In the n-stage error correcting code illustrated in FIG. 3, n generator polynomials, such as $G_1(x)$, $G_2(x)$, . . . , $G_n(x)$, are used to perform coding. When letters with suffixes (for example, $r_1$ and $bb_1$) are used in superscripts (superiors) or inferiors (subscripts), they are represented without a superscript and a subscript (for example, r1 and bb1). However, the letter with a superscript or a subscript is the same as the letter without a superscript or a subscript in meaning.

In this case, n generator polynomials, that is, $G_1(x)$, $G_2(x), \ldots, G_n(x)$ are selected such that the following n kinds of conditions are satisfied:

(1) $r_1$ is an integer and $G_1(x)=0$ have $2t_1$ ($=2 \times t_1$) roots, that is, $\alpha^{r1}, \alpha^{r1+1}, \alpha^{r1+2}, \ldots, \alpha^{2t1+r1-2}$, and $\alpha^{2t1+r1-1}$;

(2) $r_2$ is an integer and $G_1(x)*G_2(x)=0$ has $2t_2$ roots, that is, $\alpha^{r2}, \alpha^{r2+1}, \alpha^{r2+2}, \ldots, \alpha^{2t2+r2-2}$, and $\alpha^{2t2+r2-1}$; ...

(n) $r_n$ is an integer and $G_1(x)*G_2(x) \ldots *G_n(x)=0$ has $2t_n$ roots, that is, $\alpha^{rn}, \alpha^{rn+1}, \alpha^{rn+2}, \ldots, \alpha^{2tn+rn-2}$, and $\alpha^{2tn+rn-1}$.

In addition, $r_1, r_2, \ldots, r_n$ satisfy the following relation:
$r_2 \leq r_1$, $r_1+2t_1-1 \leq r_2+2t_2-1$;
$r_3 \leq r_2$, $r_2+2t_2-1 \leq r_3+2t_3-1$; ...
$r_n \leq r_{n-1}$, $r_{n-1}+2t_{n-1}-1 \leq r_n+2t_n-1$.

In this way, $t_n > t_{n-1} > \ldots > t_2 > t_1$ is satisfied.

When the above-mentioned generator polynomials are selected and $t_0=0$ and $b_i=t_i-t_{i-1}$ ($1 \leq i \leq n$) are established, parity #i calculated by $G_i(x)$ has $b_i$-bit correction capability.

When the above-mentioned generator polynomials are selected, parity #1 to parity #i are used, and there is a $t_i$-bit error in the user data+parity #1+parity #2+ ... +parity #i, the error in the user data can be corrected to obtain the original value of the user data.

Therefore, when the above-mentioned generator polynomials are selected, parity #1 to parity #n are used, and there is a $t_n$-bit error in the user data+parity #1+parity #2+ ... +parity #n, the error in the user data can be corrected to obtain the original value of the user data.

In other words, when the error correction capability of parity #1 and parity #2, which are generated by using above-mentioned generator polynomials, are n bits and m bits respectively, it is possible to correct n+m error bit included in the user data, parity #1 and parity #2 by performing error correction process using parity #1 and parity #2.

As an example of the generator polynomial which is selected so as to satisfy the above-mentioned n-1 kinds of conditions, $r_1=r_2=\ldots=r_n=1$ will be described. The minimum polynomial on GF(2) having $\alpha^i$ as the root is $M_i(x)$. $GG_i(x)$ is set so as to satisfy the following Expression 1 with respect to arbitrary integers $bb_1, bb_2, bb_3, \ldots, bb_n$ satisfying $0 < bb_1 < bb_2 < bb_3 < \ldots < bb_n$:

$$GG_i(x) = M_1(x)*M_3(x)*M_5(x)* \ldots *M_{2bbi-1}(x) \quad (1 \leq i \leq n) \quad (1)$$

In this case, the BCH code having $GG_1(x)$ as the generator polynomial can correct a $bb_i$-bit error.

$G_i(x)$ is represented by the following Expression 2:

$G_0(x)=1$; and $$G_i(x) = GG_i(x)/GG_{i-1}(x) = M_{2bb(i-1)+1}(x)*M_{2bb(i-1)+3}(x)* \ldots *M_{2bbi-1} \quad (1 \leq i \leq n) \quad (2)$$

where bb (i-1)=$bb_{i-1}$ is established.

The generator polynomial represented by Expression 2 is an example of the generator polynomial which is selected so as to satisfy the n-1 kinds of conditions and corresponds to an example in which $b_i=bb_i-bb_{i-1}$ and $t_i=bb_i$ are established in the n-1 kinds of conditions.

Figure 5:
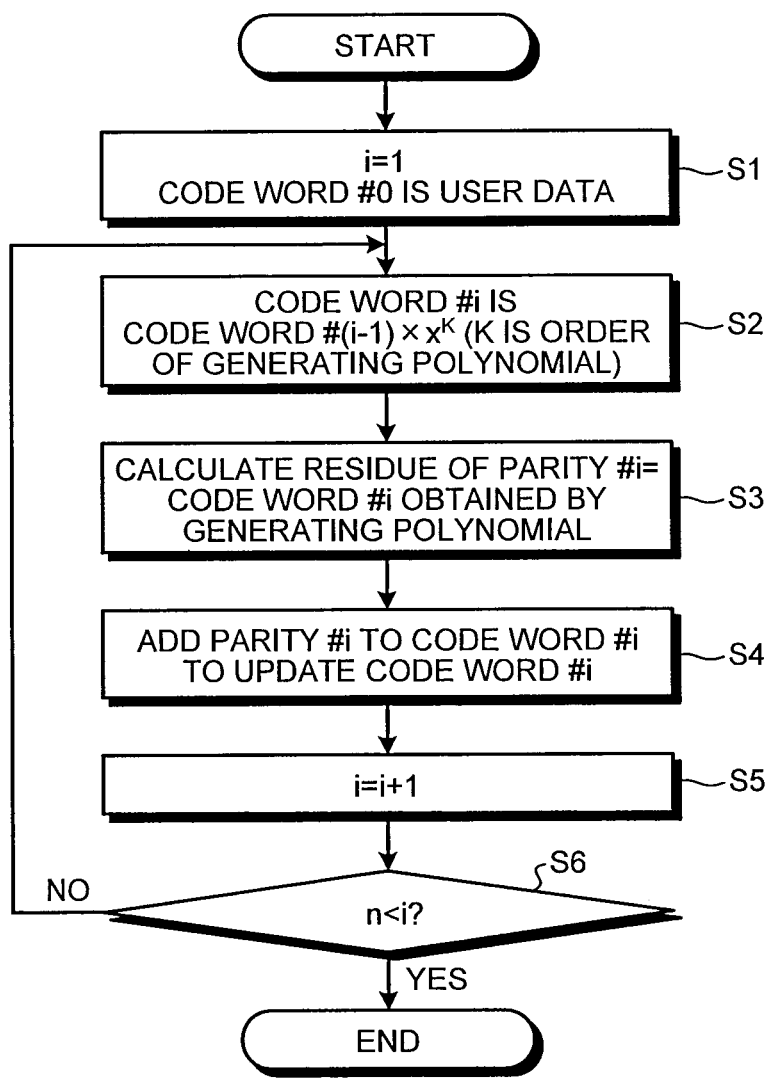
FIG. 5 is a flowchart illustrating an example of a coding process according to the first embodiment.

FIG. 5 is a flowchart illustrating an example of the coding process according to this embodiment. The process illustrated in FIG. 5 is a coding process when the above-mentioned generator polynomial is selected and n-stage coding is performed. First, "i" is set to 1 and code word #0 is used as the user data (code word #0=user data) (Step S1). Then, code word #i is set to code word #(i-1)$\times x^K$ (K is the order of the generator polynomial $G_i(x)$) (code word #i=code word #(i-1)$\times x^K$) (Step S2). Parity #i is calculated as a residue obtained by the generator polynomial $G_i(x)$ of code word #i (Step S3).

Then, parity #i is added to code word #i to update code word #i (code word #i=code word #i+parity #i) (Step S4). Then, i is set to i+1 (Step S5) and it is determined whether n<i is satisfied (Step S6). When n<i is satisfied (Yes in Step S6), the process ends. When n<i is not satisfied (No in Step S6), the process returns to Step S2.

Figure 6:
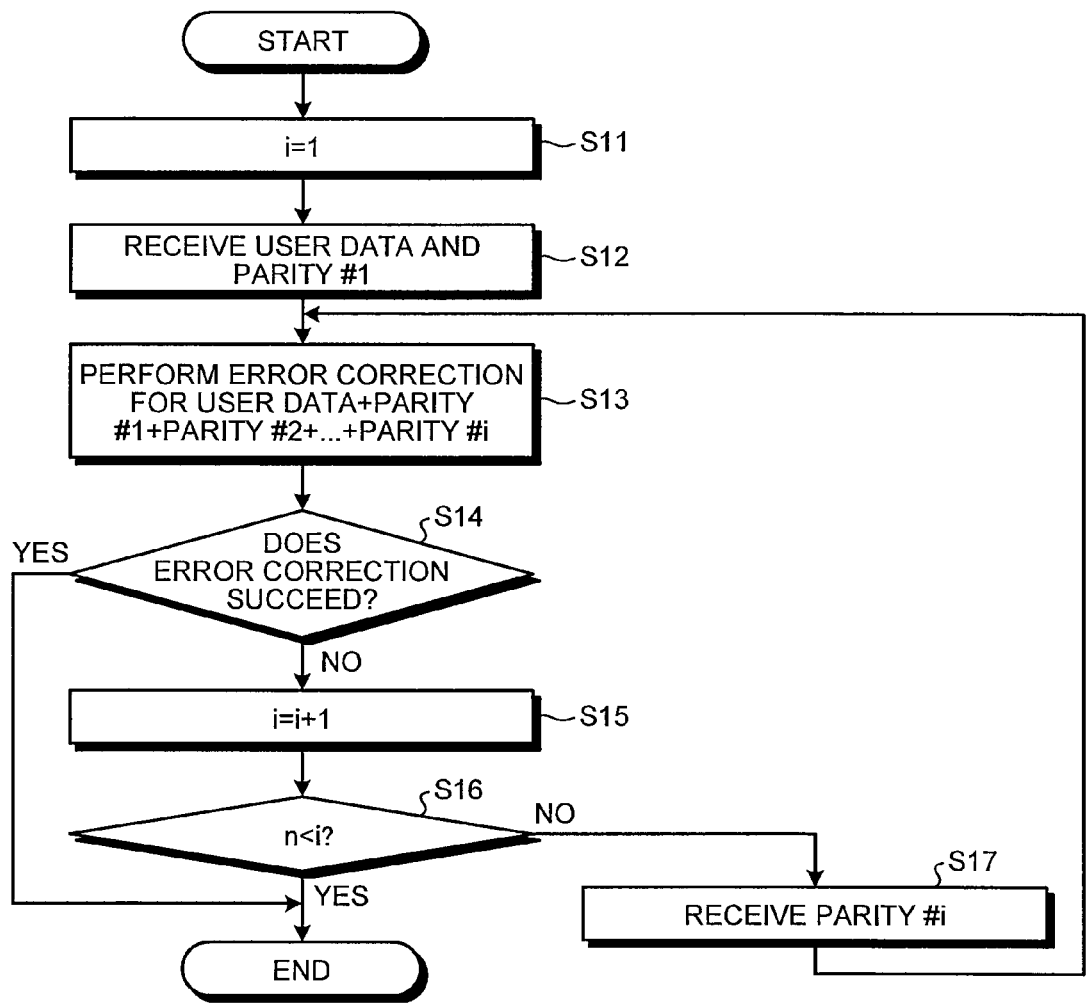
FIG. 6 is a flowchart illustrating an example of a decoding process according to the first embodiment.

FIG. 6 is a flowchart illustrating an example of the decoding process according to this embodiment. The process illustrated in FIG. 6 is a decoding process of the decoding unit 26 when the code word subjected to the coding operation described in FIG. 5 is stored in the semiconductor memory unit 3 and then read. First, i is set to 1 and user data and parity #1 are received (Step S12). Specifically, the decoding unit 26 receives user data which is read from the semiconductor memory unit 3 by the memory I/F 22 in response to an instruction from the control unit 23 and parity #1 corresponding to the user data through the internal bus 20.

Error correction is performed based on the user data and the parities from parity #1 to parity #i (Step S13). Then, it is determined whether the error correction succeeds (Step S14). When the error correction succeeds (Yes in Step S14), the process ends.

When the error correction does not succeed (No in Step S14), i is set to i+1 (Step S15) and it is determined whether n<i is satisfied (Step S16). When n<i is satisfied (Yes in Step S16), the process ends. When n<i is not satisfied (No in Step S16), the decoding unit 26 receives parity #i (Step S17) and the process returns to Step S13. Specifically, parity #i is received as follows. The decoding unit 26 notifies the control unit 23 that the error correction has failed and the control unit 23 instructs the memory I/F 22 to read parity #i based on the notice. Then, the decoding unit 26 receives parity #i which is read from the semiconductor memory unit 3 by the memory I/F 22 through the internal bus 20.

Figure 7:
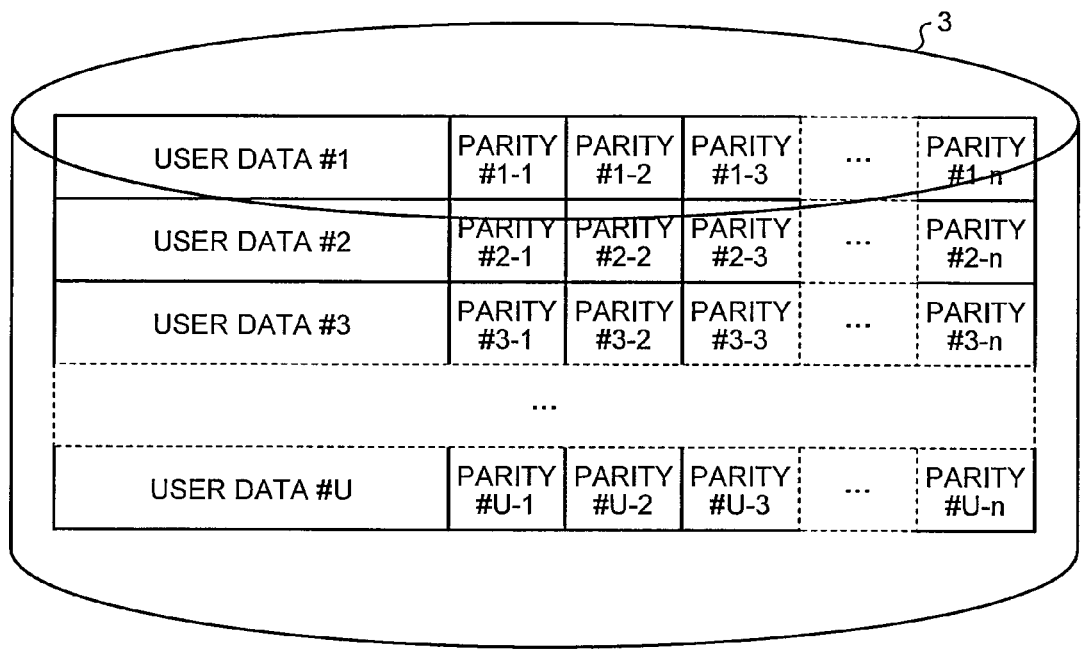
FIG. 7 is a diagram illustrating an example of the storage format of user data and parities.
Figure 8:
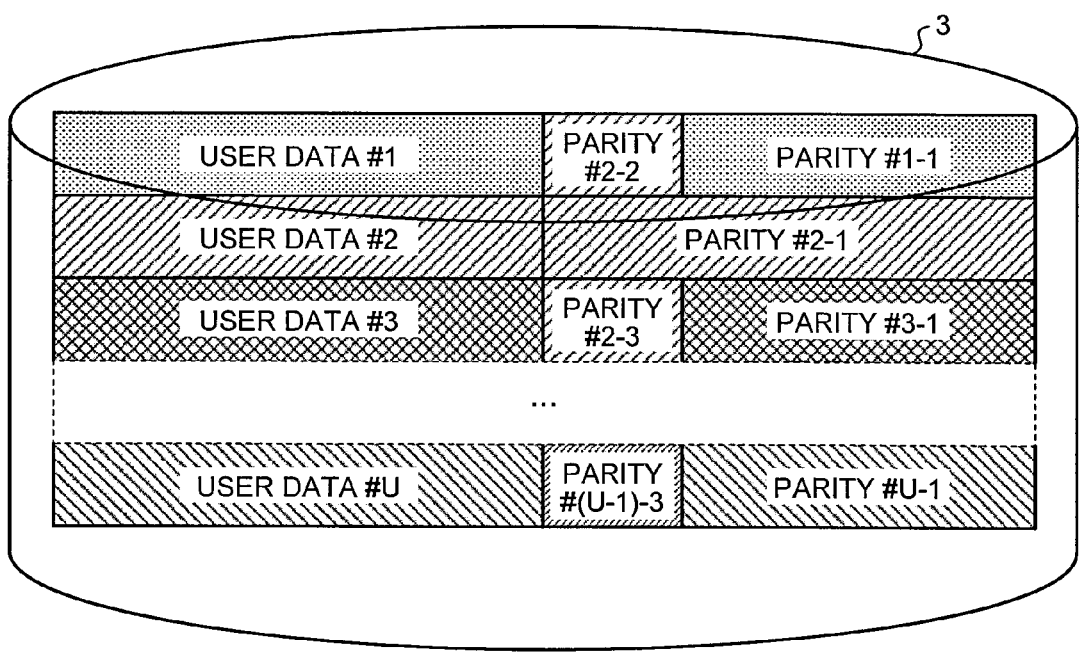
FIG. 8 is a diagram illustrating an example of the storage format of user data and parities (an example in which the number of parities varies depending on the user data)

Next, an example of a method of storing the user data and the parities in the semiconductor memory unit 3 will be described. FIGS. 7 and 8 are diagrams illustrating an example of the storage format of the user data and the parities in the semiconductor memory unit 3.

In the example illustrated in FIG. 7, all of user data items have the same size (user data #1, user data #2, ..., and user data #U have the same size) and parities with the same size are generated for all of the user data items and then stored in the semiconductor memory unit 3. In this example, parity #i-1 corresponding to parity #1 in the first stage, parity #i-2 corresponding to parity #2 in the second stage, parity #i-3 corresponding to parity #3 in the third stage, ..., and parity #i-n corresponding to parity #2 in the n-th stage are generated for user data #i (i=1, 2, ..., U) and then stored. For example, when the semiconductor memory unit 3 is a NAND memory, a row in FIG. 7 may be one page.

In FIG. 7, all of the user data items have the same size. However, even when some or all of the user data items have different sizes, parity #i-1 to parity #i-n may be generated for user data #i and then stored, similarly to the above.

In the example illustrated in FIG. 7, for all "i"s satisfying $1 \leq i \leq U$, parity #i-1 has the same size, parity #i-2 has the same size, parity #i-3 has the same size, ..., parity #i-n has the same size. However, some or all of the parities may have different sizes.

In the example illustrated in FIG. 7, all of the user data items have the same number (n) of parities. However, some or all of the user data items may have different numbers of parities.

In the example illustrated in FIG. 7, parity #i–1, parity #i–2, parity #i–3, . . . , parity #i–n are stored in a continuous region, but some or all of the parities may be stored in a discontinuous region.

In the example illustrated in FIG. 8, the number (n) of parities in user data #2 is different from that in user data #1 and user data #3, and parity #i–1, parity #i–2, parity #i–3, . . . , parity #i–n are stored in a discontinuous region. In user data #2, n is 3. In user data #1 and user data #3, n is 1. Parity #2-1 is stored in a region continuous to user data #2, parity #2-2 is stored in a region continuous to user data #1, and parity #2-3 is stored in a region continuous to user data #3. The number of parities corresponding to each user data item and the arrangement position of each parity are not limited to those illustrated in FIG. 8. For example, when the semiconductor memory unit 3 is a NAND memory, a row in FIG. 8 may be one page.

Figure 9:
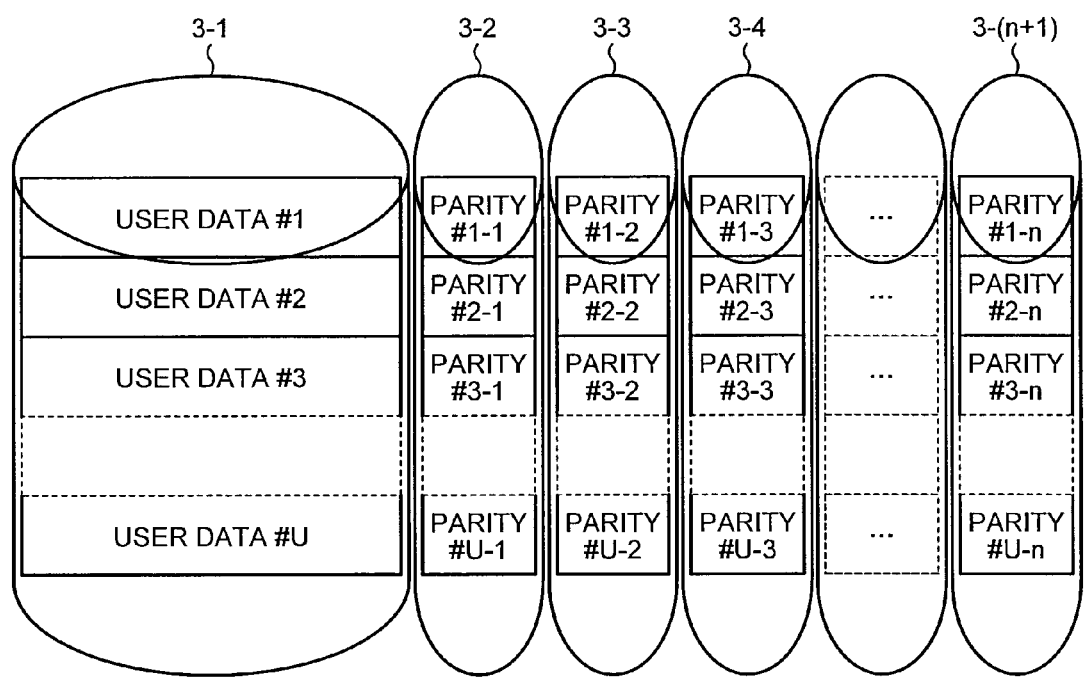
FIG. 9 is a diagram illustrating an example of the storage format of user data and parities (an example in which the user data and the parities are stored in a plurality of memory devices)

In the examples illustrated in FIGS. 6 to 8, the semiconductor memory unit 3 is one memory device. FIG. 9 illustrates an example in which the semiconductor memory unit 3 includes a plurality of memory devices, that is, memory units 3-1 to 3-(n+1). The memory units 3-1 to 3-(n+1) may be, for example, different memory chips or different types (for example, NAND memories and magnetic memory devices) of memory devices. In the example illustrated in FIG. 9, user data #1 to user data #U are stored in the memory unit 3-1, parity #i–1 is stored in the memory unit 3-2, parity #i–2 is stored in the memory unit 3-3, parity #i–3 is stored in memory unit 3-4, . . . , parity #i–n is stored in the memory unit 3-(n+1). FIG. 9 illustrates an example in which the user data and each parity are dispersed and stored in each memory unit and the detailed dispersion method is not limited to the example illustrated in FIG. 9. In the example illustrated in FIG. 9, the user data and each parity are dispersed and stored in different memory devices in the semiconductor memory unit 3. However, some of the user data items and the parities may be stored in a memory device other than the semiconductor memory unit 3.

As described above, in this embodiment, the parity is generated in multiple stages. The coding operation is performed to generate the code which is capable of improving error correction capability by using the parities in different stages for decoding in such a way that, during decoding, the parities in the first and second stages are used in error correction in the second stage and the parities in the first to third stages are used in error correction in the third stage. Therefore, it is possible to adaptively change the number of parities used in error correction according to the amount of error, without reducing the average reading speed. In addition, when the number of parities is the same, it is possible to improve error correction capability, as compared to a case in which the parities are generated in independent multiple stages.

Second Embodiment

Figure 10:
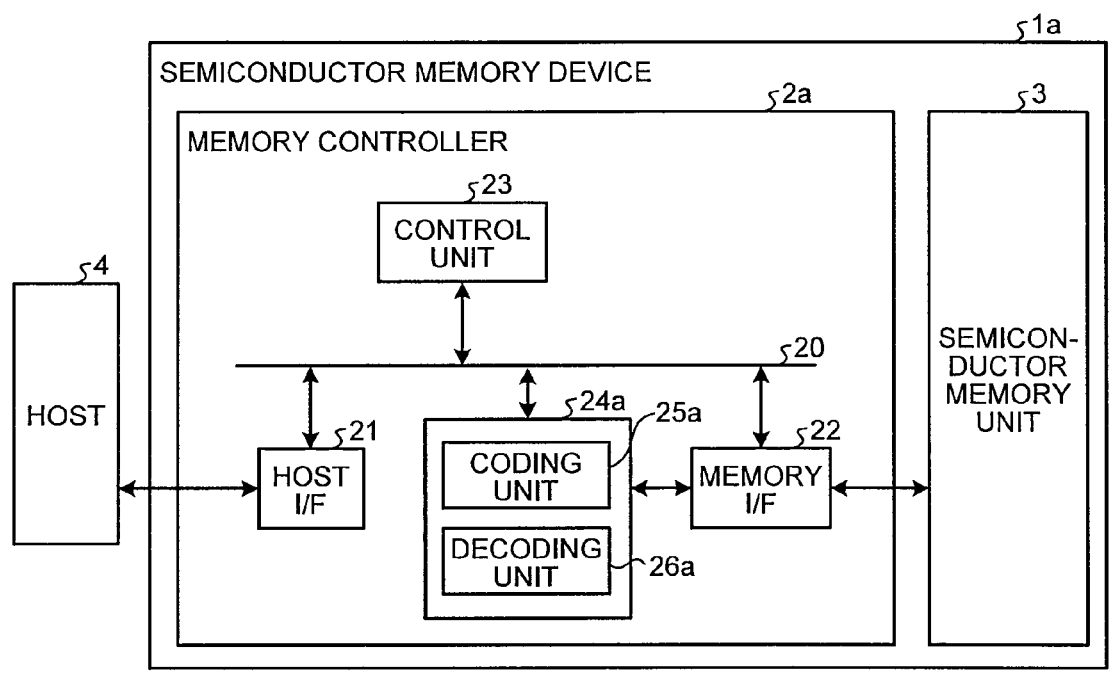
FIG. 10 is a block diagram illustrating an example of the structure of a memory system according to a second embodiment.

FIG. 10 is a block diagram illustrating an example of the structure of a memory system according to a second embodiment. A semiconductor memory device 1a according to this embodiment includes a memory controller 2a and a semiconductor memory unit 3. The semiconductor memory unit 3 is the same as the semiconductor memory unit 3 according to the first embodiment. The memory device 1a is connected to a host 4, similarly to the memory device 1 according to the first embodiment. In the second embodiment, components having the same function as those in the first embodiment are denoted by the same reference numerals as those in the first embodiment and the description thereof will not be repeated.

The memory controller 2a has the same structure as the memory controller 2 according to the first embodiment except that a coding/decoding unit 24a replaces the coding/decoding unit 24. The coding/decoding unit 24a includes a coding unit 25a and a decoding unit 26a. The operation of this embodiment is the same as that of the first embodiment except for a coding operation when data is written to the semiconductor memory unit 3 and a decoding operation when data is read from the semiconductor memory unit 3.

Figure 11:
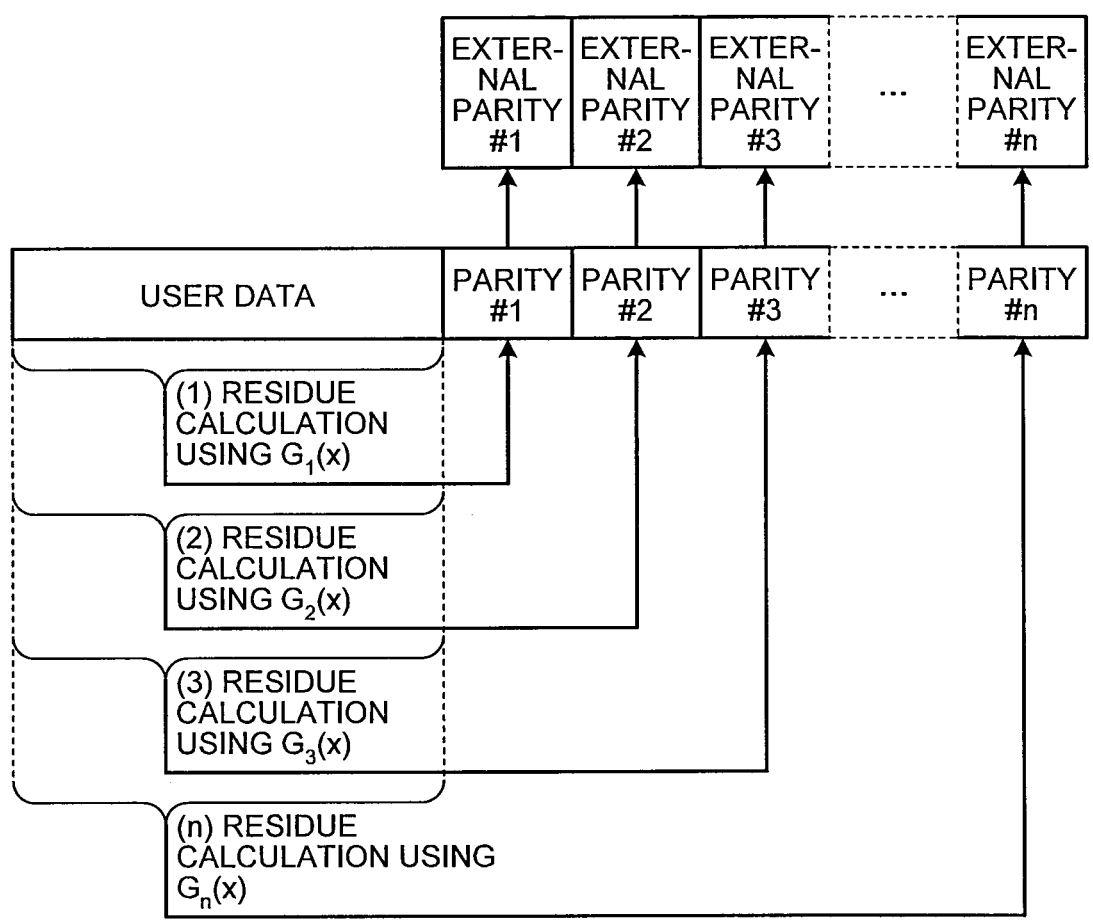
FIG. 11 is a diagram illustrating the concept of a coding operation according to the second embodiment.

The coding operation of the coding unit 25a according to this embodiment will be described. FIG. 11 is a diagram illustrating the concept of the coding operation according to this embodiment. $G_1(x)$ to $G_n(x)$ illustrated in FIG. 11 are the same as the generator polynomial $G_1(x)$ to $G_n(x)$ described in the first embodiment.

As illustrated in FIG. 11, the coding unit 25a according to this embodiment calculates parities in n stages as the coding operation as follows:

(1) Calculate parity #1 with $G_1(x)$ using user data and calculate external parity #1 which is a parity of parity #1;

(2) Calculate parity #2 with $G_2(x)$ using user data and calculate external parity #2 which is a parity of parity #2;

(3) Calculate parity #3 with $G_3(x)$ using user data and calculate external parity #3 which is a parity of parity #3; . . .

(n) Calculate parity #n (n is an integer equal to or greater than 1) with $G_n(x)$ using user data and calculate external parity #n which is a parity of parity #n.

Next, a decoding operation of the decoding unit 26a according to this embodiment will be described. The decoding unit 26a according to this embodiment performs error correction in n stages as the decoding operation as follows:

(1) Error correction is performed for parity #1 using external parity #1. When the error correction for parity #1 succeeds, error correction is performed for the user data using the error-corrected parity #1 (original parity #1 when there is no error) and the user data;

(2) When the error correction for the user data in (1) fails, error correction is performed for parity #2 using external parity #2. When the error correction for parity #2 succeeds, error correction is performed for the user data using the error-corrected parity #1, the error-corrected parity #2, and the user data;

(3) When the error correction for the user data in (2) fails, error correction is performed for parity #3 using external parity #3. When the error correction for parity #3 succeeds, error correction is performed for the user data using the error-corrected parity #1, the error-corrected parity #2, the error-corrected parity #3, and the user data; . . .

(n) When error correction for the user data in (n–1) fails, error correction is performed for parity #n using external parity #n. When the error correction for parity #n succeeds, error correction is performed for the user data using the error-corrected parity #1, the error-corrected parity #2, the error-corrected parity #3, . . . , the error-corrected parity #n, and the user data.

When error correction for parity #i using external parity #i (i=1, 2, . . . , n) fails, it is difficult to perform error correction for the user data. Therefore, the decoding unit 26a notifies the control unit 23 that the error correction for the user data has failed.

There are no restrictions in a method of storing the user data, parity #i, and external parity #i in the semiconductor memory unit 3. The user data, parity #1, and external parity #i may be stored in continuous regions, or may be store so as to be dispersed. In addition, as described in the first embodiment, the user data, parity #i, and external parity #i may be dispersed and stored in a plurality of memory devices. For example, when the semiconductor memory unit 3 is a NAND memory, parity #1 to parity #n may be stored in the same page as that in which the user data is stored and external parity #1 to external parity #n may be stored in a memory device other than the semiconductor memory unit 3. In addition, parity #1 may be stored in the same page as that in which the user data is stored and parity #2 to parity #n and external parity #1 to external parity #n may be stored in other pages.

As described above, in this embodiment, the parity in each stage is generated based on the user data using the same generator polynomial as that in the first embodiment and the external parity, which is a parity of the parity in each stage, is generated. Therefore, it is possible to perform the operation of correcting the error of the user data such that no error is included in the parity. As a result, it is possible to improve the operation speed, as compared to the first embodiment.

Third Embodiment

Figures 12, 13:
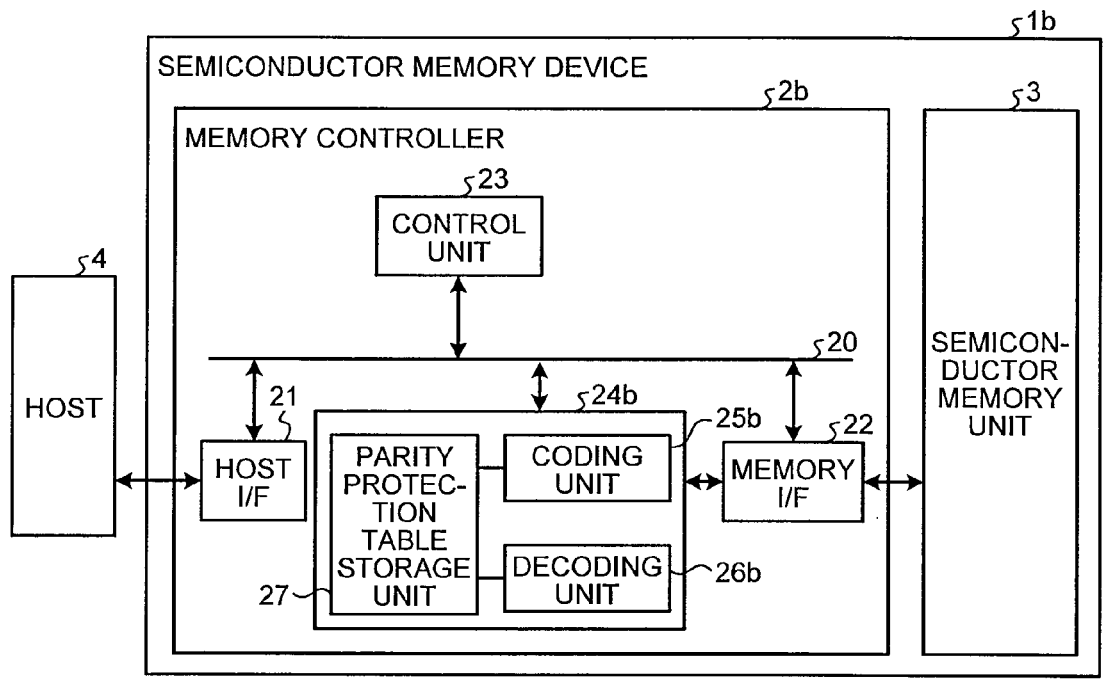
FIG. 12 is a block diagram illustrating an example of the structure of a memory system according to a third embodiment.
FIG. 13 is a diagram illustrating an example of a parity protection table.

FIG. 12 is a block diagram illustrating an example of the structure of a memory system according to a third embodiment. A semiconductor memory device 1b according to this embodiment includes a memory controller 2b and a semiconductor memory unit 3. The semiconductor memory unit 3 is the same as the semiconductor memory unit 3 according to the first embodiment. The memory device 1b is connected to a host 4, similarly to the memory device 1 according to the first embodiment. In the third embodiment, components having the same functions as those in the first embodiment are denoted by the same reference numerals as those in the first embodiment and the description thereof will not be repeated.

The memory controller 2b is the same as the memory controller 2 according to the first embodiment except that a coding/decoding unit 24b replaces the coding/decoding unit 24. The coding/decoding unit 24b includes a coding unit 25b, a decoding unit 26b, and a parity protection table storage unit 27. The operation of this embodiment is the same as that of the first embodiment except for a coding operation when data is written to the semiconductor memory unit 3 and a decoding operation when data is read from the semiconductor memory unit 3.

In the first embodiment, in the main portion of the error correction process in the n-th stage, the error correction targets of parity #1, parity #2, . . . , parity #n are the user data+parity #1+parity #2+ . . . +parity #n and all parities are the error correction targets. That is, error correction is performed on the assumption that errors are likely to be included in parity #1, parity #2, . . . , parity #n.

In contrast, in the second embodiment, the error correction targets of parity #1, parity #2, . . . , parity #n are only the user data, and parity #1, parity #2, . . . , parity #n are not the error correction targets of parity #1, parity #2, . . . , parity #n. Parity #1, parity #2, . . . , parity #n are the error correction targets of external parity #1, external parity #2, . . . , external parity #n different from parity #1, parity #2, . . . , parity #n.

That is, when there is an error in parity #i (1≤i≤n), parity #i is corrected using parity #i and parity j (i<j) in the first embodiment and parity #i is corrected using external parity #i in the second embodiment.

In this embodiment, whether the error of parity #i is corrected by the method according to the first embodiment or the method according to the second embodiment is set for each parity #i and parity protection information indicating the parity to be used to correct the error of parity #i is stored as a parity protection table. Then, when a coding operation and a decoding operation are performed, they are performed according to the parity protection table. The parity protection table can be arbitrarily set to arbitrarily set the parity to be used to correct the error of parity #i. The parity protection table is stored in the parity protection table storage unit 27.

FIG. 13 is a diagram illustrating an example of the parity protection table. In the table illustrated in FIG. 13, the vertical direction indicates a parity which is an error correction target and the horizontal direction indicates a parity which can be used for error correction. In the table illustrated in FIG. 13, a circle indicates that error correction is available and a cross indicates that it is difficult to use parity. In addition, in the table illustrated in FIG. 13, when parity #i is an error correction target, parity #1 to parity #i are represented by "–" since they are not changed depending on settings. For example, error correction can be performed for parity #1 in the first row using parity #1 which is obviously used and parity #2, parity #3, . . . , parity #n which are represented by circles. Error correction can be performed for parity #2 using parity #2 which is obviously used and the external parity. Error correction can be performed for parity #3 using parity #3 which is obviously used and the external parity. The parity protection table illustrated in FIG. 13 is an illustrative example and the detailed content of the parity protection table is not limited to the example.

Figure 14:
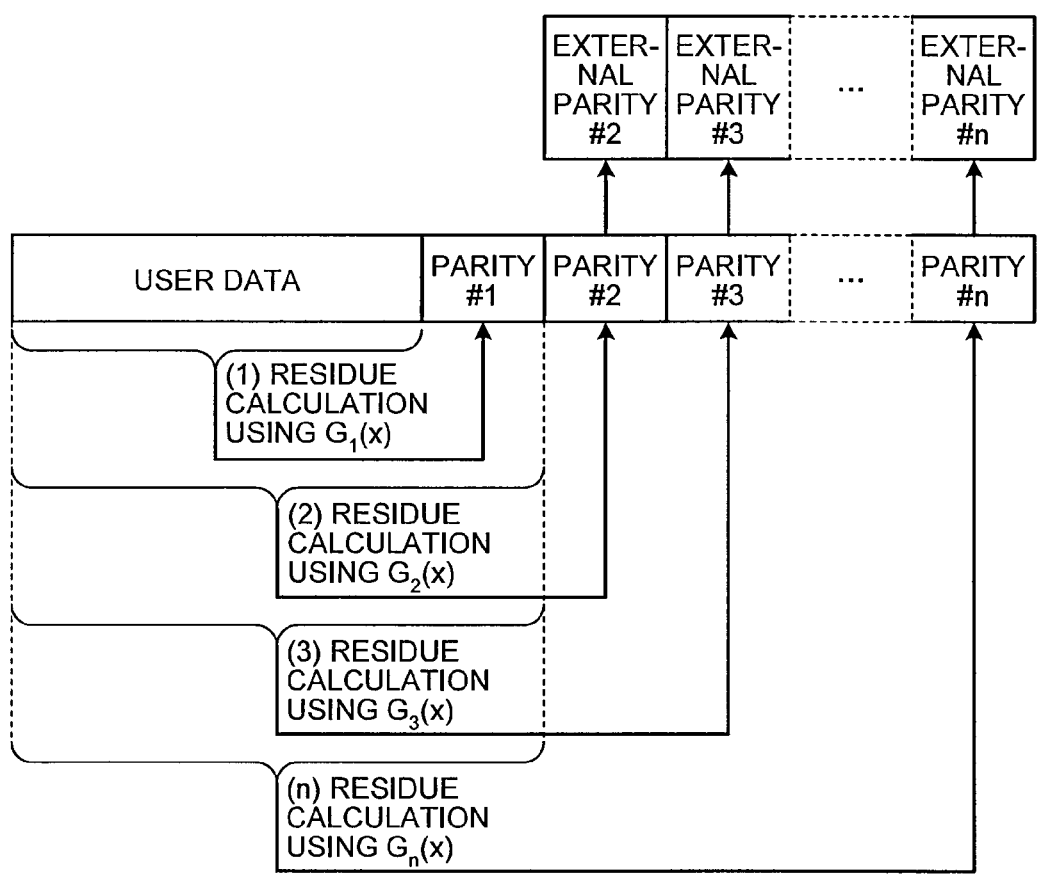
FIG. 14 is a diagram illustrating the concept of a coding operation according to the third embodiment.

FIG. 14 is a diagram illustrating the concept of the coding operation according to this embodiment. FIG. 14 illustrates an example of the coding operation corresponding to the parity protection table illustrated in FIG. 13.

In the example illustrated in FIG. 14, the coding unit 25b calculates parities in n stages as the coding operation as follows:

(1) Calculate parity #1 with $G_1(x)$ using the user data;
(2) Calculate parity #2 with $G_2(x)$ using the user data and parity #1 and calculate external parity #2 which is a parity of parity #2;
(3) Calculate parity #3 with $G_3(x)$ using the user data and parity #1 and calculate external parity #3 which is a parity of parity #3; . . .
(n) Calculate parity #n (n is an integer equal to or greater than 1) with $G_n(x)$ using the user data and parity #1 and calculate external parity #n which is a parity of parity #n.

The coding unit 25b selects a parity generating method based on the parity protection table and generates a corresponding parity. For example, in the example illustrated in FIG. 13, for parity #1, since the external parity is not used, similarly to the first embodiment, parity #1 is generated based on the user data and the external parity for parity #1 is not generated. For parity #2, since the external parity is used, parity #2 is generated based on the user data and the external parity for parity #2 is generated.

When all of parity #1 to parity #(i−1) are protected by the external parities, parity #i may be generated based on only the user data. When there is a parity which is not protected by the external parities among parity #1 to parity #(i−1), all of the parities which are not protected by the user data+the external parities are used to generate parity #i.

The decoding unit 26b selects a parity decoding method based on the parity protection table and performs a corresponding error correction process. For example, in the example illustrated in FIG. 13, in a first-stage error correction process using parity #1, since no external parity is generated, the error of the user data is corrected based on parity #1 and the user data, similarly to the first embodiment. For parity #2, since the external parity is generated, the error of parity #2 is corrected using the external parity of parity #2 and the error of the user data is corrected based on parity #1, parity #2, and the user data.

Figure 15:
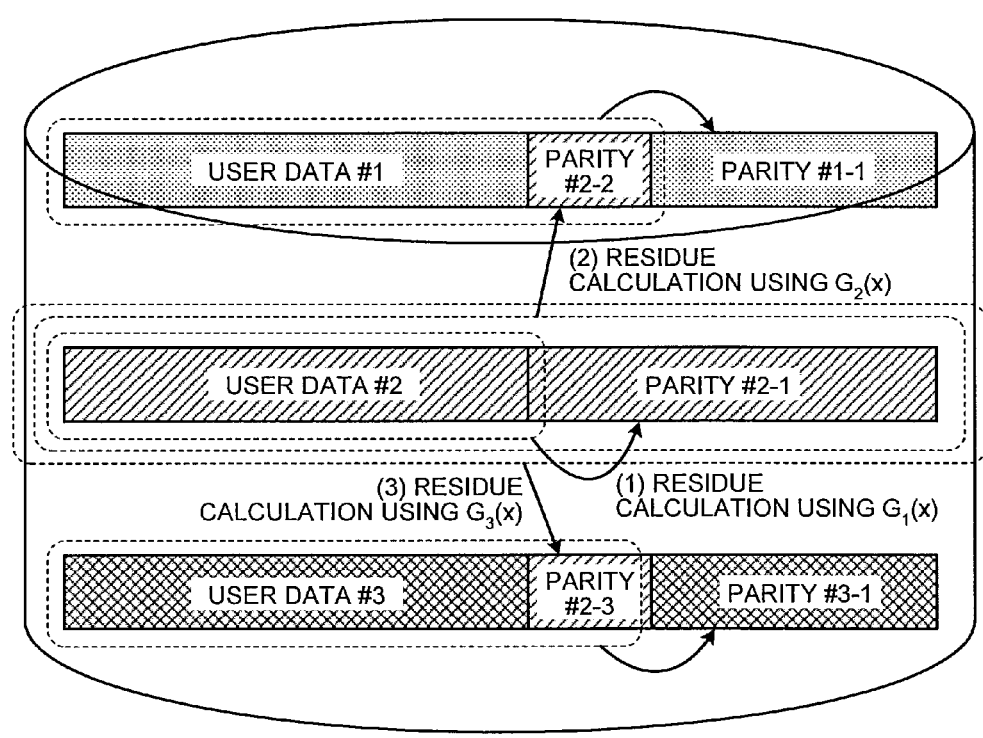
FIG. 15 is a diagram illustrating the concept of a decoding process and an example of the storage of user data and parities in the third embodiment.

FIG. 15 is a diagram illustrating the concept of the decoding operation according to this embodiment and an example of the storage of user data and parities. FIG. 15 illustrates an example in which, for user data #1, user data #2, and user data #3, the number of parities allocated to user data #2 is more than that allocated to user data #1 and user data #3 as an example of the storage of user data in the semiconductor memory unit 3. A three-stage coding operation is performed for user data #2 illustrated in FIG. 15 and a one-stage coding operation is performed for user data #1 and user data #3. In this embodiment, it is assumed that the semiconductor memory unit 3 is a NAND memory and user data #1, user data #2, and user data #3 are stored in different pages.

Specifically, for user data #2, parity #2-1 is generated as a first-stage parity (there is no external parity for parity #2-1). Parity #2-2 is generated as a second-stage parity and an external parity (parity #1-1 illustrated in FIG. 15 corresponds to the external parity) of parity #2-2 is generated. Parity #2-3 is generated as a third-stage parity and an external parity (parity #3-1 illustrated in FIG. 15 corresponds to the external parity) of parity #2-3 is generated. For user data #1, parity #1-1 is generated considering user data #1 and parity #2-2 as general user data. Similarly, for user data #3, parity #3-1 is generated considering user data #3 and parity #2-3 as general user data. As such, parity #1-1 is the parity of user data #1 and is also the external parity of parity #2-2. In addition, parity #3-1 is the parity of user data #3 and is also the external parity of parity #2-3.

In the example illustrated in FIG. 15, the external parities of user data #2 encoded in multiple stages are stored in different pages and the error correction target of the parities (parity #1-1 and parity #3-1) in different pages include the user data and the parity of user data #2 stored in the page. However, a method of generating the external parity is not limited to this method. The external parity of the parity of user page #2 may be generated separately from the parities of user data in different pages (user data #1 and user data #3) and then stored in the semiconductor memory unit 3 or another memory device.

Next, a process of decoding user data #2 in the example illustrated in FIG. 15 will be described.

(1) Error correction is performed for the user data using user data #2 and parity #2-1.

(2) When the error correction for the user data in (1) fails, error correction is performed for parity #2-2 using parity #1-1, which is the external parity, and user data #1, and parity #2-2. When the error correction for parity #2-2 succeeds, error correction is performed for user data #2 using parity #2-1, the error-corrected parity #2-2, and user data #2.

(3) When the error correction for the user data in (2) fails, error correction is performed for parity #2-3 using parity #3-1, which is the external parity, and user data #3, and parity #2-3. When the error correction for parity #2-3 succeeds, error correction is performed for user data #2 using parity #2-1, the error-corrected parity #2-2, the error-corrected parity #2-3, and user data #2.

Figure 16:
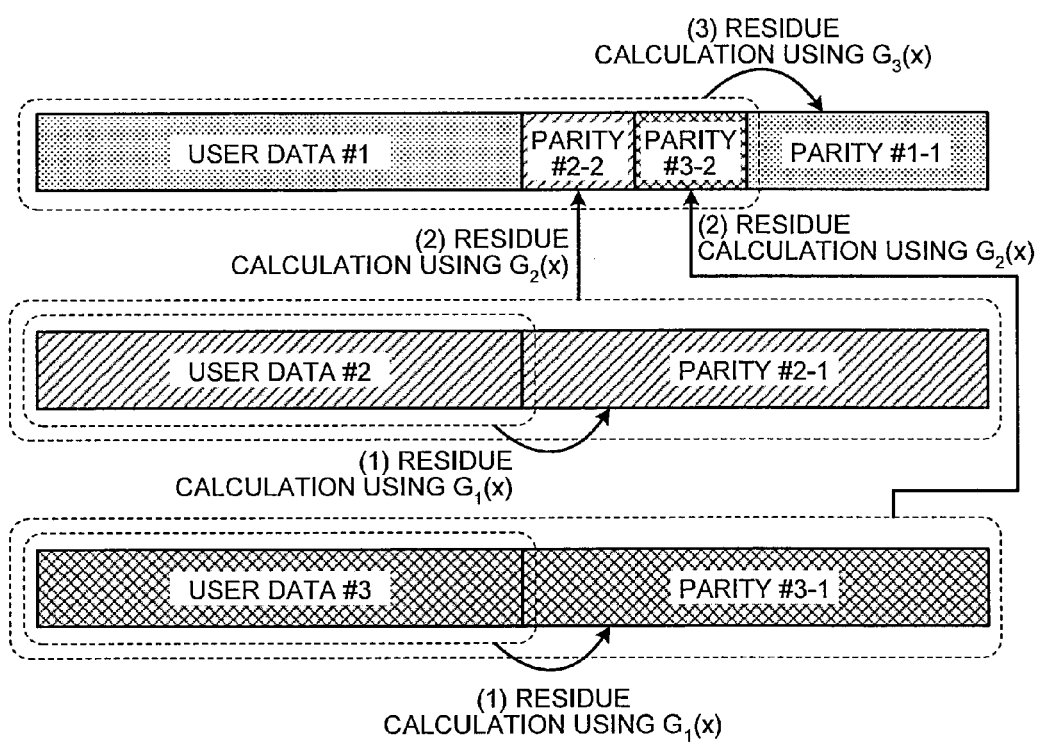
FIG. 16 is a diagram illustrating an example of the storage of the user data and the parities when an external parity is calculated from one user data item and a plurality of parities.

FIG. 16 is a diagram illustrating an example of the storage of the user data and the parities when the external parities are calculated from one user data item and a plurality of parities. In the example illustrated in FIG. 16, for user data #2 and user data #3, the parities are generated in three stages. For user data #1, the parity is generated in one stage. For user data #2 and user data #3, parity #2-1 and parity #3-1 are generated as the first-stage parities based on the generator polynomial $G_1(x)$ and parity #2-2 and parity #3-2 are generated as the second-stage parities based on the generator polynomial $G_2(x)$. Then, parity #1-1 is generated for user data #1, parity #2-2, and parity #3-2 using the generator polynomial $G_3(x)$. Parity #1-1 is the external parity of parity #2-2 and parity #3-2.

Figure 17:
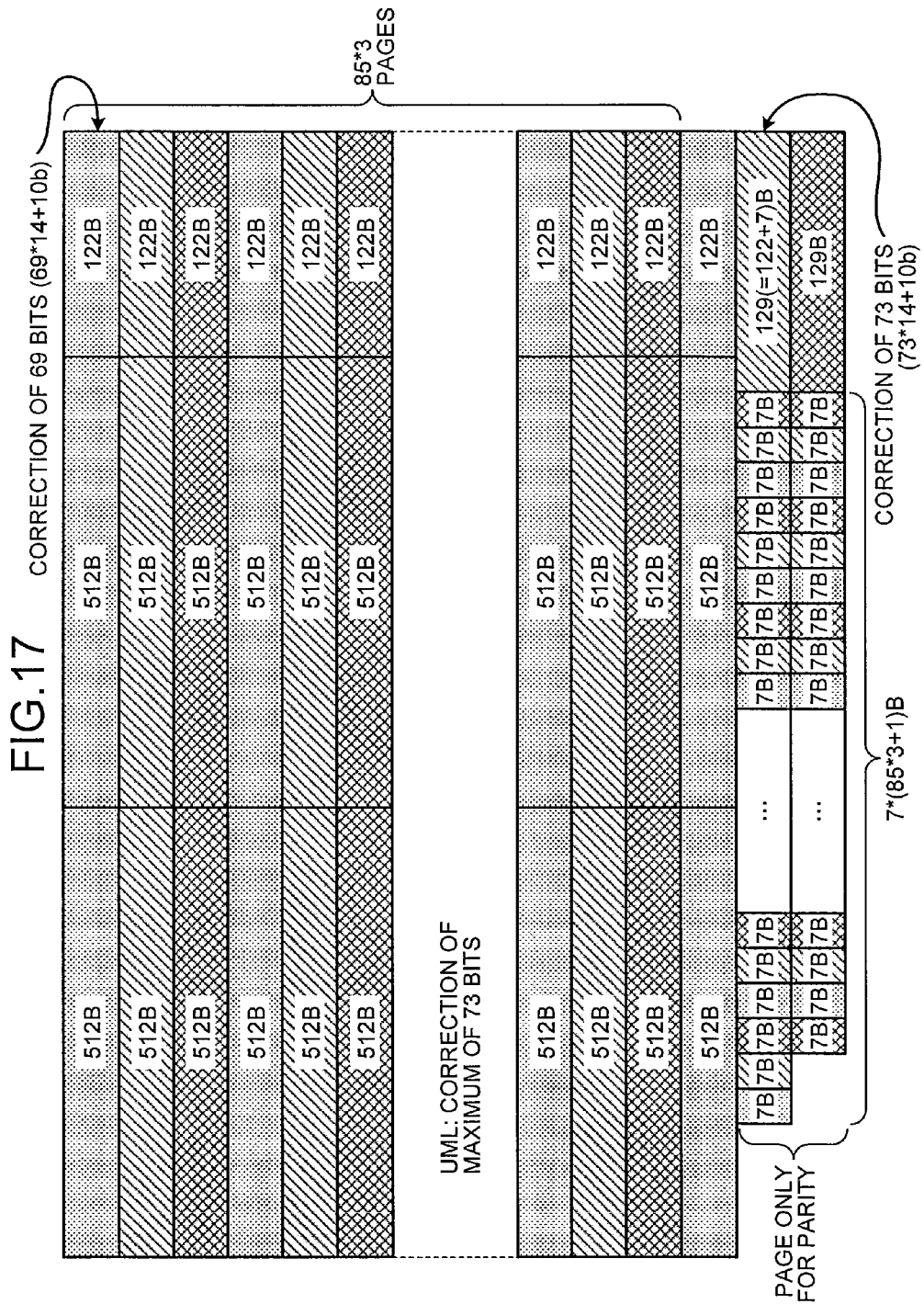
FIG. 17 is a diagram illustrating an example of the storage format of user data and parities (an example in which the parity is stored in a page only for parity)
Figure 18:
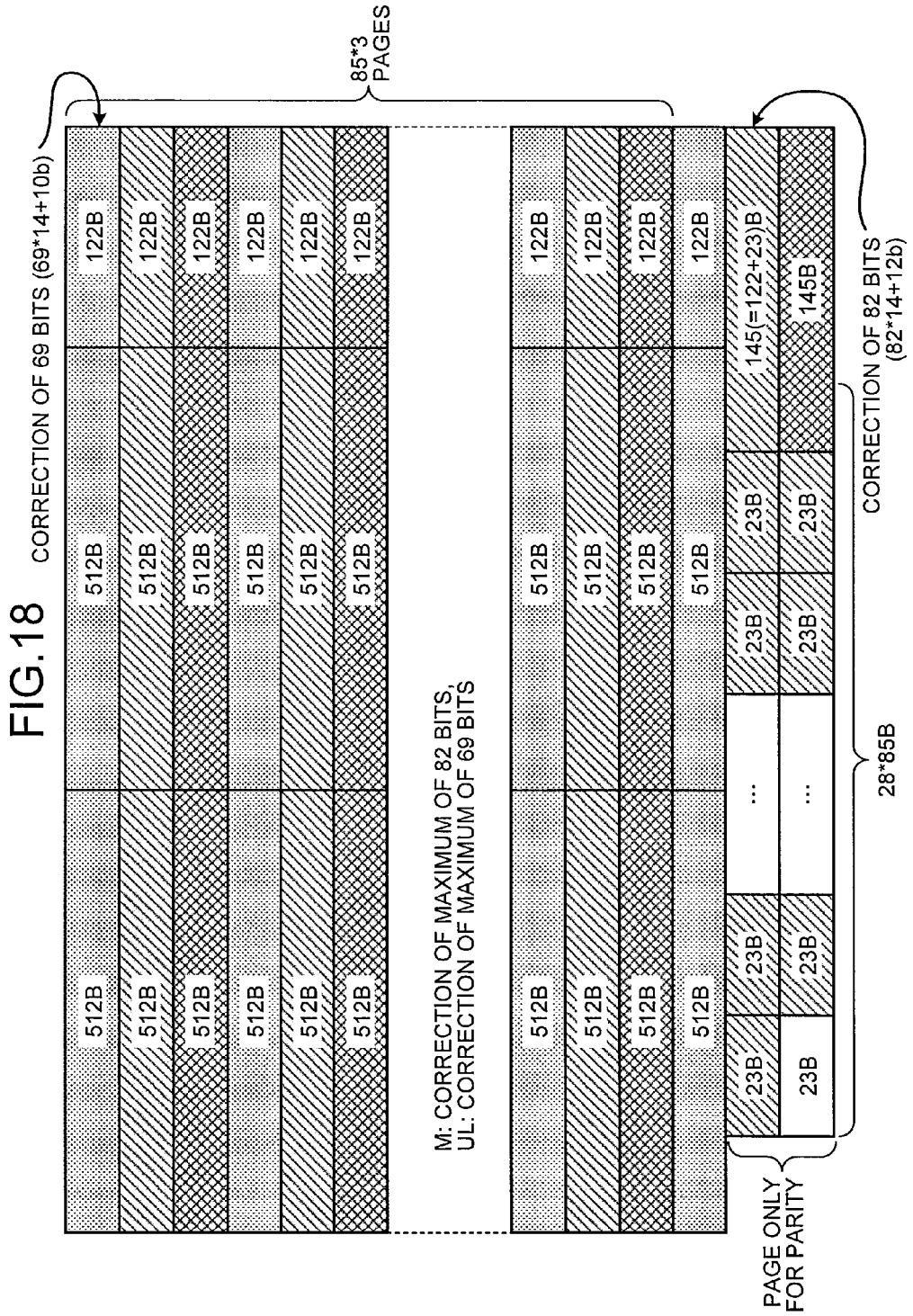
FIG. 18 is a diagram illustrating an example of the storage format of user data and parities (an example in which the parity is stored in the page only for parity and the number of parities varies depending on the page)
Figure 19:
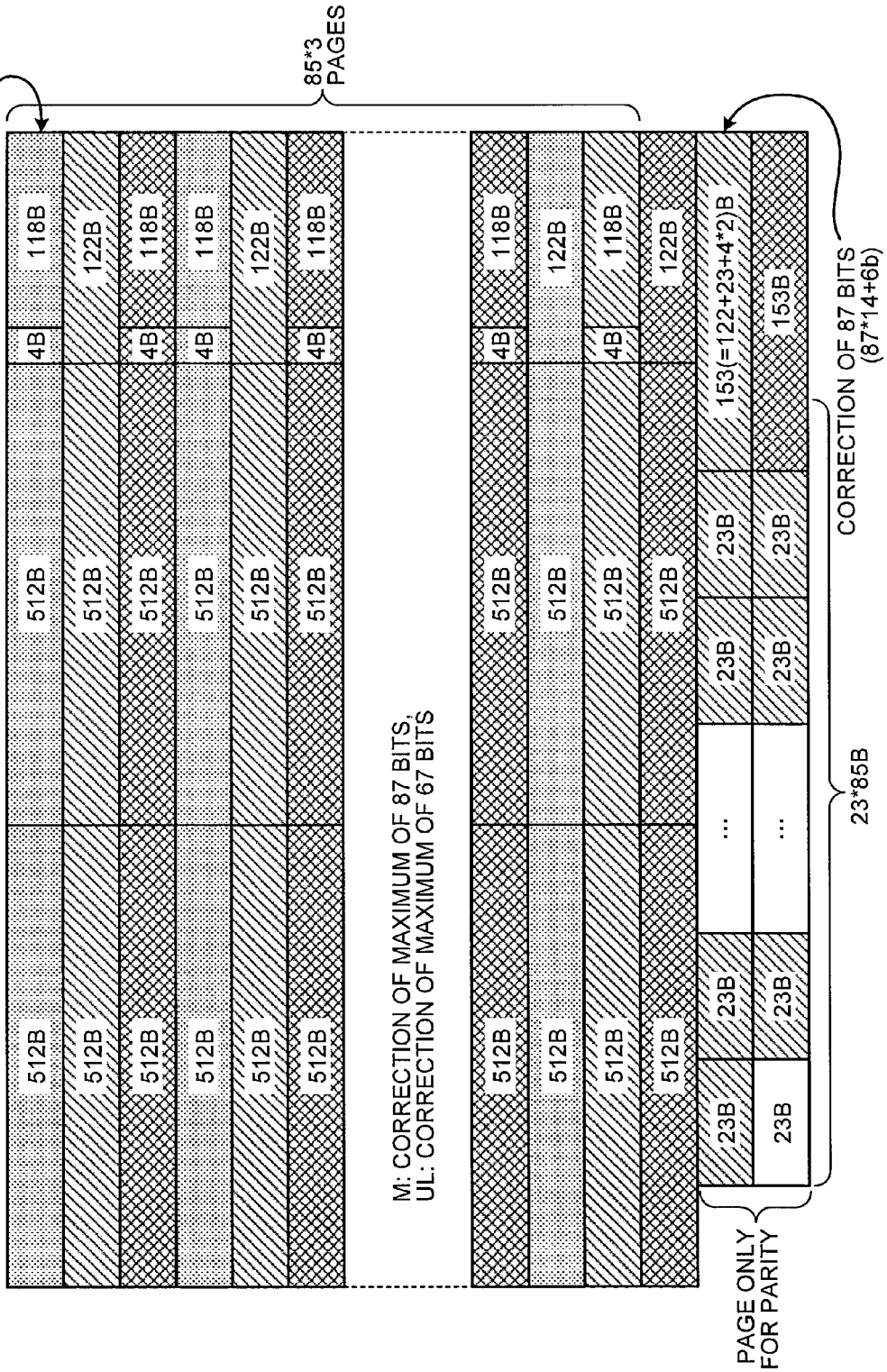
FIG. 19 is a diagram illustrating an example of the storage format of user data and parities (an example in which the parity is stored in the page only for parity and is also stored in another page)

FIGS. 17 to 19 illustrate an example of a method of storing the user data and each parity according to this embodiment when the semiconductor memory unit 3 is a NAND memory. Here, it is assumed that 3-bit data is stored in one memory cell, different pages are allocated to three bits, and the pages stored in one word line are referred to as a lower (L) page, a middle (M) page, and an upper (U) page. However, the NAND memory forming the semiconductor memory unit 3 is not limited to this type of memory. In FIGS. 17 and 18, the lower page, the middle page, and the upper page are hatched in different patterns except for a page only for parity. For example, in FIGS. 17 to 19, the first row is the lower page, the second row is the middle page, the third row is the upper page, and the fourth row is the lower page. For the page only for parity, a page for the lower page, a parity for the middle page, and a parity for the upper page are hatched in the same patterns as those in which the lower page, the middle page, and the upper page are hatched. The page only for parity may be any one of the lower page, the middle page, and the upper page. FIGS. 17 to 19 illustrate examples of the middle page (second stage from the bottom) and the upper page (lowest stage) as the pages only for parity.

In the examples illustrated in FIGS. 17 and 18, some of the parities (in which no user data is stored) are stored in the page only for parity. In the example illustrated in FIG. 17, the parities with the same size are allocated to the lower page, the middle page, and the upper page. The parity (122B) generated in the first stage is stored in the same page as each corresponding user data item (512B×2) and the parity (7B) generated in the second stage is stored in two pages only for parity in the first and second rows from the bottom. In the lowest page only for parity, the second-stage parity is treated in the same way as the user data to generate an external parity (129B) and the external parity is stored in each page (page only for parity).

In the example illustrated in FIG. 17, for all of the lower page, the middle page, and the upper page, 69 bits can be corrected using the first-stage parity (122B) stored in each of the pages, and 73 bits can be corrected using the second-stage parities (7B) stored in the pages only for parity.

In the example illustrated in FIG. 18, the first-stage parities with the same size are allocated to all of the lower page, the middle page, and the upper page. The parity (122B) generated in the first stage is stored in the same page as that each corresponding user data item (512B×2). The second-stage parity (23B) is generated for the middle page and is then stored in two pages only for parity in the first and second rows from the bottom. In addition, in the lowest page only for parity, the second-stage parity is treated in the same way as the user data to generate an external parity (145B) and the external parity is stored in each page (each page only for parity).

In the example illustrated in FIG. 18, for all of the lower page, the middle page, and the upper page, 69 bits can be corrected using the first-stage parity (122B) stored in each of the pages. For the middle page, 82 bits can be corrected using the second-stage parity (23B) stored in the page only for parity.

In the example illustrated in FIG. 19, the size of the first-stage parity in the middle page is more than that of the first-stage parity in the lower page and the upper page. The first-stage parity in the middle page is 122B which can be corrected up to 69 bits and the first-stage parity in the lower page and the upper page is 118B which can be corrected up to 67 bits. The second-stage parity (23B) is generated for the middle page and is then stored in two pages only for parity in the first and second rows from the bottom. In addition, a third-stage parity and a fourth-stage parity (each parity is 4B) are generated for the middle page and are then stored in the lower page and the upper page. In the lowest page only for parity, the second-stage parity is treated in the same way as the user data to generate an external parity (153B) and the external parity is stored in each page (each page only for parity).

In the example illustrated in FIG. 19, for the lower page and the upper page, 67 bits can be corrected. For the middle page, 69 bits can be corrected using the first-stage parity which is stored in the same page as the user data, 82 bits can be corrected using the second-stage parity in the page only for parity, and 87 bits can be corrected using all parities in the first to fourth stages.

As in the examples illustrated in FIGS. 18 and 19, when the size of the parity is changed for each page, for example, it is possible to allocate the parity with a large size to the page with low reliability. When the actual number of errors is small, the parity in the page is only read. In addition, as described above, in the coding operation in which the parity in each stage is added to perform error correction, when the number of parities is the same, it is possible to improve error correction capability, as compared to a case in which the parities are independently generated in multiple stages.

In the examples illustrated in FIGS. 18 and 19, the parity with a large size is allocated to one page among three pages and the parities with the same size are allocated to the remaining two pages. However, parities with different sizes may be allocated to the three pages.

As described above, in this embodiment, the parity for protecting parity #i can be set using the parity protection table, which makes it possible to combine the coding and decoding operations according to the first embodiment with the coding and decoding operation according to the second embodiment. Therefore, it is possible to perform appropriate coding and decoding operations in response to, for example, a demand for the assumed number of errors or the assumed operation speed.

Fourth Embodiment

Figure 20:
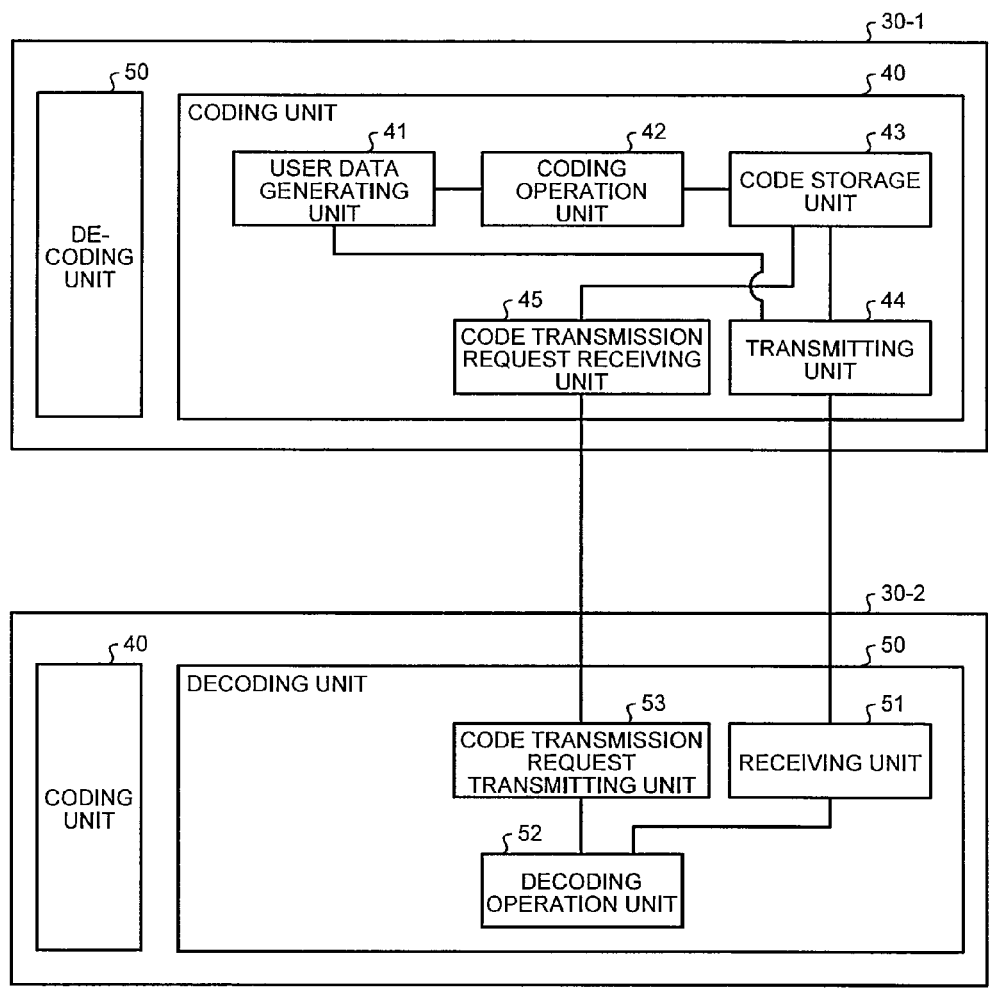
FIG. 20 is a block diagram illustrating an example of the structure of a communication device of an error correction device according to a fourth embodiment.

FIG. 20 is a block diagram illustrating an example of the structure of a communication device including an error correction device according to a fourth embodiment. FIG. 20 illustrates components used in an error correction process. For example, in FIG. 20, a function which is generally used by the communication device, such as an antenna when the communication device is a wireless communication device, is not illustrated.

Communication devices 30-1 and 30-2 have a transmission function and a reception function, respectively. User data transmitted from the communication device 30-1 is received by the communication device 30-2 and user data transmitted from the communication device 30-2 is received by the communication device 30-1. In some cases, an error occurs in a communication path between the communication device 30-1 and the communication device 30-2.

The multi-stage coding described in the first embodiment can be also applied to correct the error in such a communication path.

The communication devices 30-1 and 30-2 have the same structure. As illustrated in FIG. 20, the communication devices 30-1 and 30-2 include a coding unit 40 and a decoding unit 50. The coding unit 40 includes a user data generating unit 41, a coding operation unit 42, a code storage unit 43, a transmitting unit 44, and a code transmission request receiving unit 45. The decoding unit 50 includes a receiving unit 51, a decoding operation unit 52, and a code transmission request transmitting unit 53. The coding unit 40 and the decoding unit 50 form the error correction device according to this embodiment.

First, an operation of transmitting user data will be described. For example, when the user data is transmitted from the communication device 30-1 to the communication device 30-2, the user data generating unit 41 of the communication device 30-1 generates the user data and inputs the user data to the coding operation unit 42. The coding operation unit 42 generates parities using the same multi-stage coding operation as that in the first embodiment (or the second embodiment or the third embodiment) and stores the parities in the code storage unit 43. For example, it is assumed that parity #1 to parity #n are stored. The transmitting unit 44 transmits the user data and the parity (for example, parity #1) up to a predetermined stage to the communication device 30-2. When the coding according to the third embodiment is performed, the communication device 30-1 and the communication device 30-2 store parity protection tables.

In the communication device 30-2, the receiving unit 51 receives the user data and the parity (for example, parity #1) and inputs them to the decoding operation unit 52. The decoding operation unit 52 performs the same process as that in the first embodiment (or the second embodiment or the third embodiment) for the received parity. For example, when the coding operation according to the first embodiment is performed and parity #1 is received, the decoding operation unit 52 corrects the error of the user data on the basis of parity #1 and the user data. When the error correction succeeds, the decoding operation unit 52 ends the process of receiving the user data. On the other hand, when the error correction fails, the decoding operation unit 52 notifies the code transmission request transmitting unit 53 that the error correction has failed. When receiving the notice, the code transmission request transmitting unit 53 transmits a request to transmit the parity (for example, parity #2) in the next stage for the user data to the communication device 30-1. In addition, when the error correction fails, the decoding operation unit 52 stores the received parity and user data.

When receiving the transmission request from the communication device 30-2, the code transmission request receiving unit 45 of the communication device 30-1 performs control such that the corresponding parity is output from the code storage unit 43 to the transmitting unit 44. The transmitting unit 44 transmits the input parity to the communication device 30-1. The receiving unit 51 of the communication device 30-1 transmits the parity to the decoding operation unit 52. The decoding operation unit 52 performs the decoding operation using the stored parity and user data and the newly received parity. When error correction fails in the decoding operation, the decoding operation unit 52 repeatedly performs a process of requesting the transmission of the parity in the next stage, receiving the parity, and performing the decoding operation using the stored parity and user data and the received parity.

For example, first, the communication device 30-1 may transmit the parities in stages in such a manner that it transmits the user data and parity #1 described in the first embodiment, transmits parity #2 when a parity transmission request is received (that is, when error correction by parity #1 fails), and transmits parity #2 when a parity transmission request is received (that is, error correction by parity #1 and parity #2 fails). In this way, it is possible to adaptively change the number of parities used for error correction depending on the amount of error. In addition, it is possible to perform error correction even when the number of errors is large while preventing the unnecessary use of a communication band due to the parity.

In this embodiment, the communication devices 30-1 and 30-2 generate the user data. However, the communication devices 30-1 and 30-2 may be connected to, for example, a user terminal, receive user data from the user terminal, and decode the received user data.

Fifth Embodiment

Figure 21:
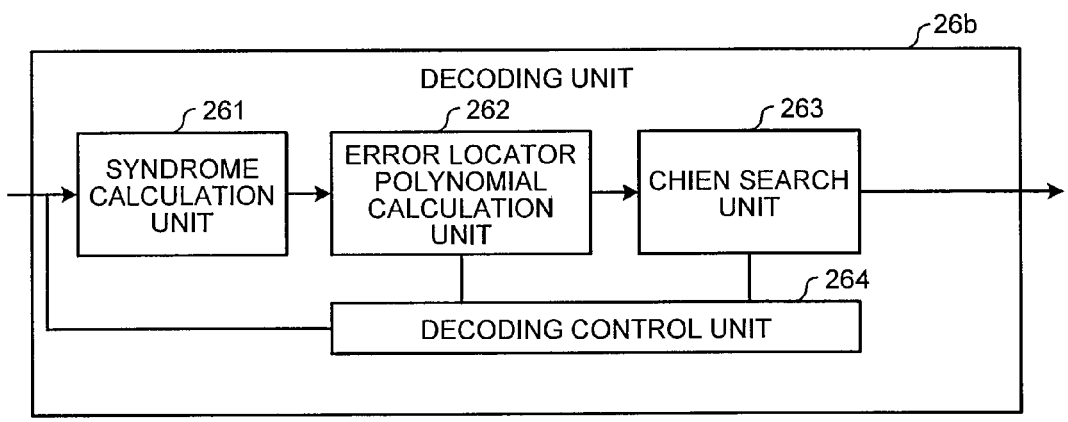
FIG. 21 is a block diagram illustrating an example of the structure of a decoding unit of a semiconductor memory device according to a fifth embodiment.

FIG. 21 is a block diagram illustrating an example of the structure of a decoding unit of a semiconductor memory device according to a fifth embodiment. In this embodiment, an example of the structure and operation of a decoding unit 26b for implementing the multi-stage error correction method described in the third embodiment will be described.

As illustrated in FIG. 21, the decoding unit 26b according to this embodiment includes a syndrome calculation unit 261, an error locator polynomial calculation unit 262, a Chien search unit 263, and a decoding control unit 264.

Figure 22:
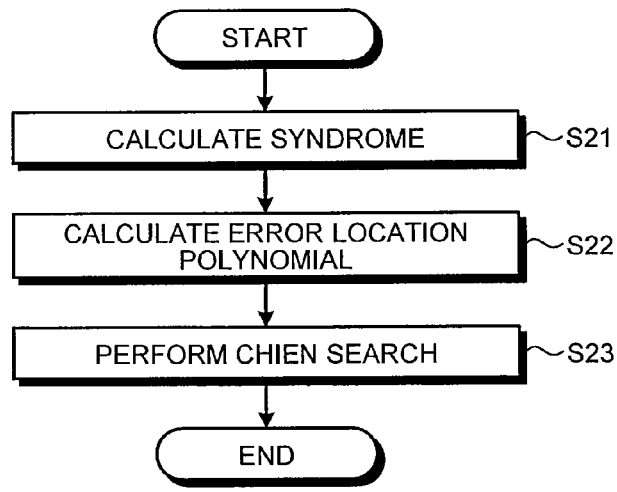
FIG. 22 is a flowchart illustrating an example of a decoding process according to the fifth embodiment.

FIG. 22 is a flowchart illustrating an example of a decoding process according to this embodiment. The overall operation of the decoding process according to this embodiment will be described with reference to FIGS. 21 and 22. When receiving a request to read data from a host 4 through a host I/F 21, the control unit 23 instructs the memory I/F 22 to read data, which is a read target, and the memory I/F 22 reads the data, which is a read target, and a parity corresponding to the data and transmits the data and the parity to the decoding unit 26b. When receiving the data, which is a read target, and the parity from the memory I/F 22, the decoding unit 26b starts the decoding process.

In this embodiment, similarly to the third embodiment, a coding operation is performed by the multi-stage error correction method. Next, an example in which parties are generated in two stages in the coding operation and an external parity is generated for the second-stage parity will be described. However, the number of stages in the multi-stage error correction method or a method of giving the external parity is not limited to the above, and the external parity may not be used. The decoding process according to this embodiment can be applied to a multi-stage error correction method without using an external parity. In this case, for example, the decoding process is performed assuming that there is no error in the second-stage parity.

The process illustrated in FIG. 22 corresponds to one stage in the multi-stage decoding operation. As described in the first to third embodiments, the decoding process is performed according to the procedure using the first-stage parity illustrated in FIG. 22. When error correction fails, the decoding process is performed using the second-stage parity. At that time, when the external parity is given to the second-stage parity, the decoding process using the external parity is performed according to the same procedure as that in FIG. 22 and the second-stage decoding process is performed using the decoded (error-corrected) second-stage parity.

First, when the decoding process starts, the decoding control unit 264 instructs the syndrome calculation unit 261 to calculate a syndrome and the syndrome calculation unit 261 calculates a syndrome (Step S21). Then, the decoding control unit 264 instructs the error locator polynomial calculation unit 262 to calculate an error polynomial using the calculation result of the syndrome, and the error locator polynomial calculation unit 262 calculates an error locator polynomial (Step S22).

Then, the decoding control unit 264 instructs the Chien search unit 263 to perform a Chien search using the calculation result of the error locator polynomial. The Chien search unit 263 performs the Chien search using a coefficient of the error locator polynomial, which is the calculation result of the error locator polynomial (Step S23), specifies an error location, and ends the process. The decoding control unit 264 inverts a bit where it is determined that there is an error by the Chien search, thereby performing error correction.

In the decoding process using the first-stage parity, the user data (read data) and the first-stage parity are input to the syndrome calculation unit 261. In this embodiment, in the decoding process using the first-stage parity, when it is determined that error correction is unavailable, the external parity is given to the second-stage parity. Therefore, the decoding process is performed using the external parity and the second-stage parity. Then, the user data, the first-stage parity, and the error-corrected second-stage parity are input to the syndrome calculation unit 261 and the decoding process in the second stage is performed. The decoding process using the external parity and the second-stage parity may be performed using the syndrome calculation unit 261, the error locator polynomial calculation unit 262, the Chien search unit 263, and the decoding control unit 264 illustrated in FIG. 21, or it may be performed by a decoding circuit which is provided separately from these units.

Hereinafter, in this embodiment, it is assumed that parity #1 is generated as the first-stage parity on the basis of the generator polynomial $G_1(x)$ described in the first embodiment, parity #2 is generated as the second-stage parity on the basis of the generator polynomial $G_2(x)$, and an external parity of parity #2 is generated.

It is assumed that parity #1 has an error correction capability $t_1$ (a $t_1$-bit error can be corrected) and error correction capability when both parity #1 and parity #2 are used is $t_2$ (a $t_2$-bit error can be corrected). In this case, a decoding circuit corresponding to the error correction capability $t_1$ and a decoding circuit corresponding to the error correction capability $t_2$ may be independently provided and separately used for each stage. However, when the circuits are independently provided, the size of hardware increases. Therefore, it is preferable that the decoding circuit be shared. In this embodiment, a structure and an operation when the decoding processes in each stage are performed by a single decoding circuit will be described.

First, the syndrome calculation unit 261 according to this embodiment will be described. In general, the syndrome calculation unit 261 includes calculation circuits (including, for example, a multiplier of $\alpha^i$, an XOR circuit, and a register), which are minimum units each including a multiplier of $\alpha^i$, corresponding to the number of bits whose error can be corrected. A superscript "i" in $\alpha^i$ corresponds to an exponent part of the root of $G_i(x) \times G_2(x)$ (roots $\alpha^1, \alpha^2, \alpha^3, \alpha^4, \alpha^5, \alpha^6, \alpha^{2t2-1}$ when $\alpha$ is a primitive element of a Galois extension field $GF(2^m)$). Here, the calculation circuit (a circuit for calculating a syndrome $S_i$), which is the minimum unit, is called a syndrome $S_i$ calculation circuit. A total of $t_2$ syndrome $S_i$ calculation circuits corresponding to at least i=1, 3, 5, . . . , $2t_2-1$ are provided in order to share the circuit between a first-stage error correction process (decoding process) and a second-stage error correction process.

Figure 23:
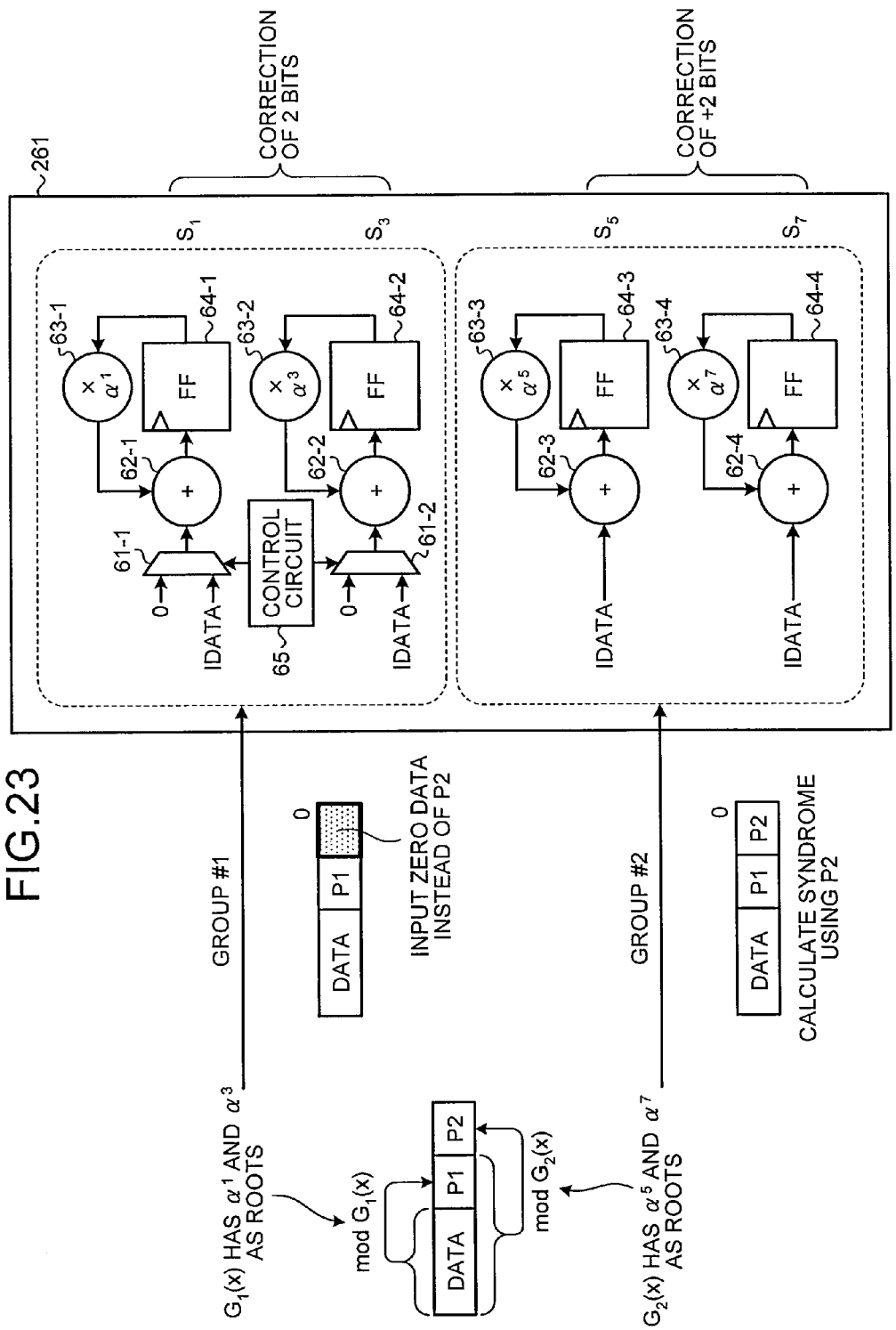
FIG. 23 is a diagram illustrating an example of the structure of a syndrome calculation unit.

FIG. 23 is a diagram illustrating an example of the structure of the syndrome calculation unit 261. FIG. 23 illustrates an example in which parity #1 and parity #2 each have capability to correct a 2-bit error. However, the correction capability of each of parity #1 and parity #2 is not limited thereto. Here, circuits with high correction capability corresponding to second-stage error correction capability $t_2$ ($t_2$=2 in the example illustrated in FIG. 23) are provided in order to share a decoding circuit capable of performing an error correction process using the second-stage parity #1 and parity #2.

The syndrome $S_i$ calculation circuit includes m-bit Galois extension field multiplication circuits 62-$j$ (j=(i+1)/2) which multiply $\alpha^i$, m-bit registers (FF (Flip-Flop)) 64-$j$ which store the calculation result of the syndrome $S_i$, and m-bit XOR circuits 62-$j$. The above-mentioned structure is the same as that of the general syndrome calculation circuit. In this embodiment, the syndrome $S_i$ calculation circuits having $\alpha^i$ as the root of $G_1(x)$ form group #1 and the syndrome $S_i$ calculation circuits having $\alpha^i$ as the root of $G_2(x)$ form group #2. In this embodiment, selector circuits (selection circuits) 61-$j$ which switch a value used to update the syndrome register between input data (IDATA) and 0 are provided for the syndrome $S_i$ calculation circuits belonging to group #1, and at least one control circuit 65 which controls the selector circuits 61-$j$ is included in group #1. The input data is user data and parities. In the example illustrated in FIG. 23, one control circuit 65 is included in group #1. However, for example, the control circuit may be provided for each selector circuit.

Figure 24:
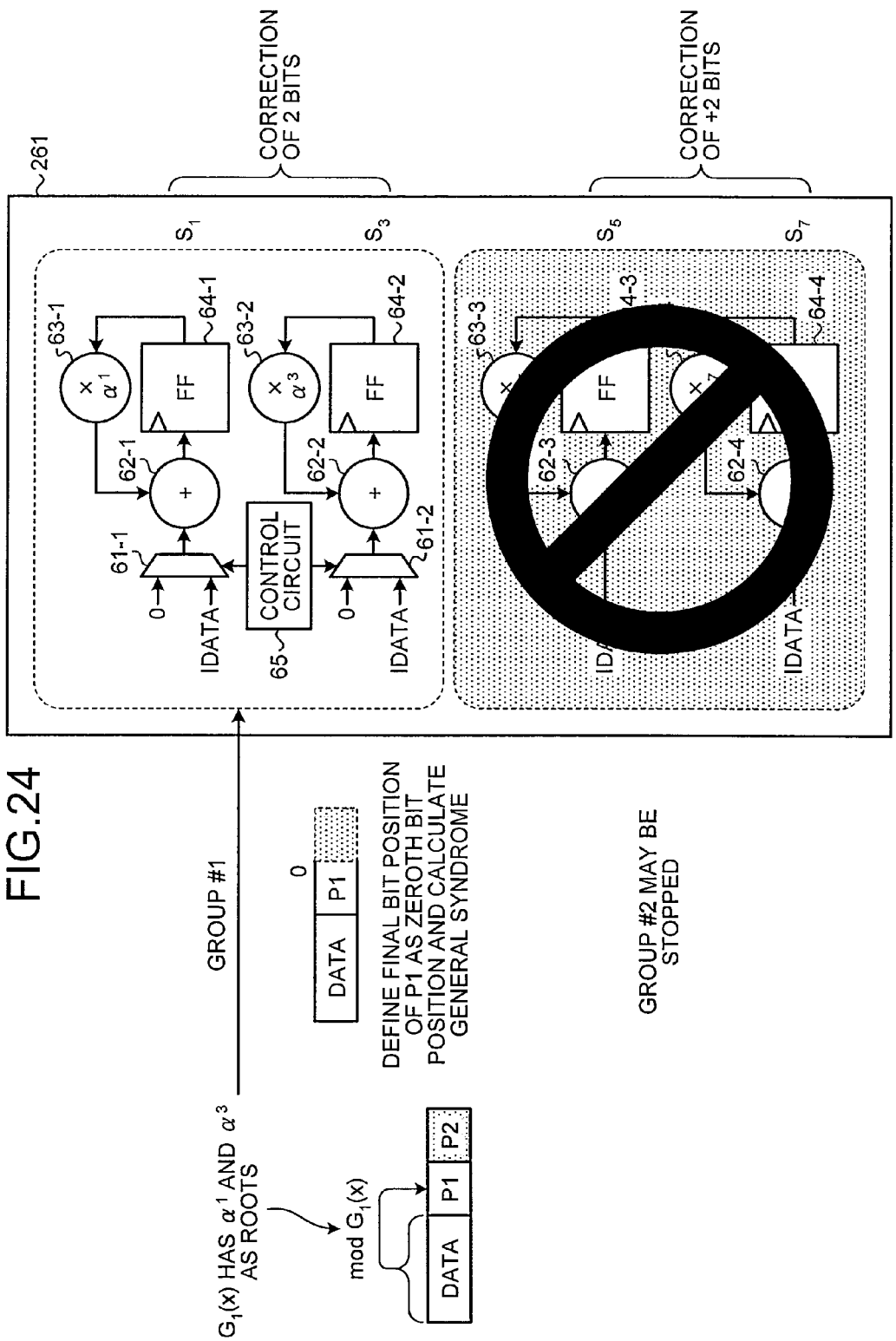
FIG. 24 is a diagram illustrating the usage state of circuits in a first-stage error correction process.

FIG. 24 is a diagram illustrating the usage state of the circuits in the first-stage error correction process. FIG. 24 illustrates the usage state of the circuits when error correction is performed by the syndrome calculation unit 261 illustrated in FIG. 23 using the first-stage parity #1 (using the first-stage parity #1 and the user data as an input). In the first-stage error correction, as illustrated in FIG. 24, the syndrome $S_i$ calculation circuit belonging to group #1 may be used and the syndrome $S_i$ calculation circuit belonging to group #2 may be stopped. In the first-stage error correction, the control circuit 65 performs control such that the selector circuit 61-$j$ selects input data (user data and parity #1). In FIGS. 23 and 24, user data, parity #1, and parity #2 are abbreviated to Data, P1, and P2, respectively.

As illustrated in FIG. 24, in the first-stage error correction, parity #2 is not input, the position of the final bit of parity #1 is defined as a zeroth position, and the syndrome is generally calculated. In general, in the error correction process, data is sequentially input to the syndrome calculation circuit from a high-order term in polynomial representation, and the error location is specified in the Chien search process, using the final input bit as a zeroth bit. Here, it is assumed that user data and parity are input in this order and the final bit (finally input bit) of the parity is used as the zeroth bit. A syndrome calculation method in the first-stage error correction process is the same as that in the general error correction process. Processes other than the calculation of the syndrome in the first-stage error correction process are also the same as those in the general error correction process.

Figure 25:
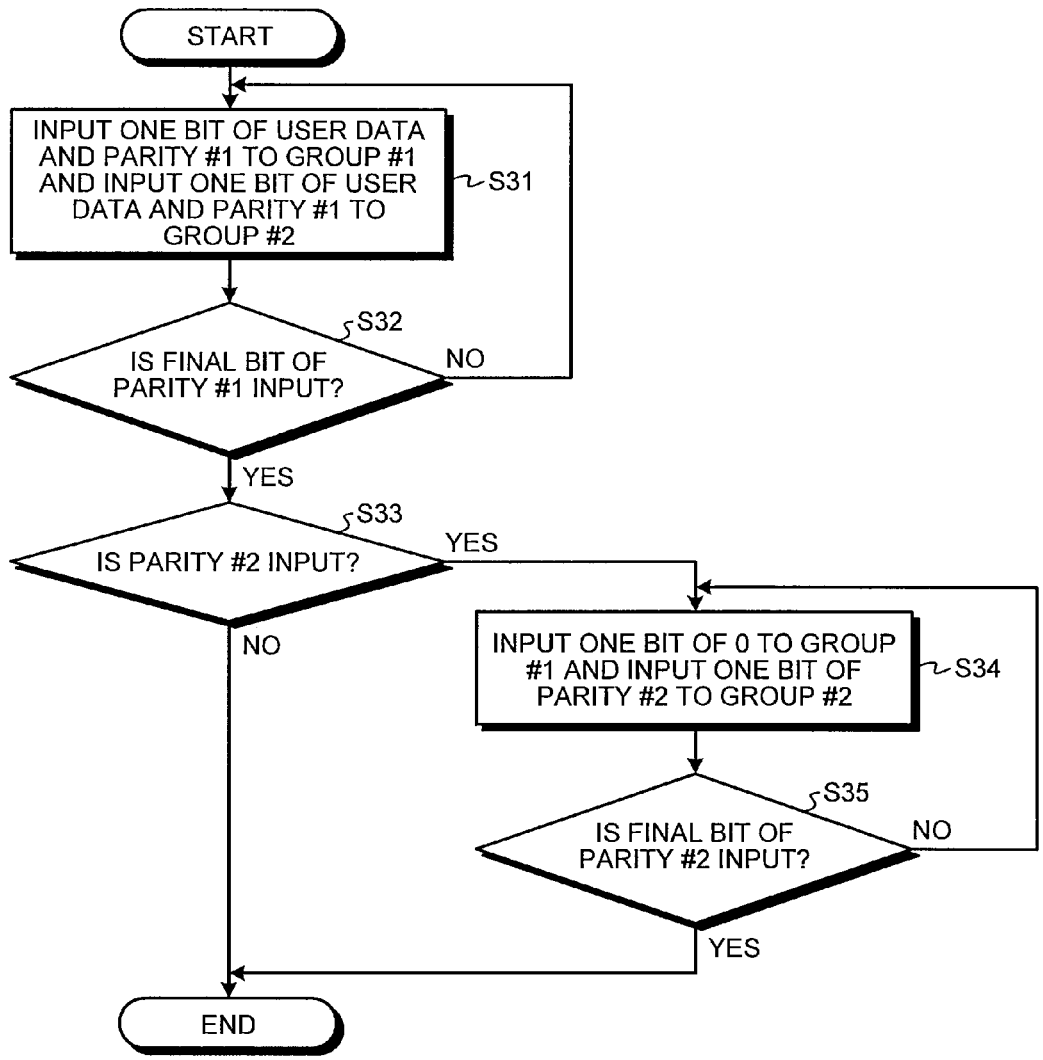
FIG. 25 is a flowchart illustrating an example a syndrome calculation process according to the fifth embodiment.

Next, the syndrome calculation process according to this embodiment will be described. FIG. 25 is a flowchart illustrating an example of the syndrome calculation process according to this embodiment. As described above, the second-stage error correction process is performed when the first-stage error correction process fails. However, in the second-stage error correction process, when the external parity is given to parity #2, it is assumed that parity #2 has been subjected to error correction using the external parity.

First, one bit of user data and parity #1 is input to the syndrome $S_i$ calculation circuits in group #1 and group #2 from the high-order term (Step S31). Specifically, in the example illustrated in FIG. 23, the control circuit 65 controls the selector circuits 61-1 and 61-2 such that input data (user data and parity) is selected. In this way, one bit of input data is input to all of the selector circuits 61-1 to 61-4.

Then, the control circuit 65 determines whether the final bit of parity #1 is input (Step S32). When the final bit of parity #1 is not input (No in Step S32), the process returns to Step S31 and one bit of input data in the next-order term is input. Whether the final bit of parity #1 is input can be determined by, for example, the comparison between the number of input bits and the number of bits of the user data+parity #1.

When the final bit of parity #1 is input (Yes in Step S32), it is determined whether parity #2 is input (that is, the process is the second-stage error correction process) (Step S33). When parity #2 is not input (No in Step S33), the process ends.

When parity #2 is input (Yes in Step S33), one bit, 0, is input to the syndrome $S_i$ calculation circuits in group #1 and one bit of parity #2 is input to the syndrome $S_i$ calculation circuits in group #2 from the high-order term (Step S34). Specifically, in the example illustrated in FIG. 23, the control circuit 65 controls the selector circuits 61-1 and 61-2 such that 0 is selected.

Then, the control circuit 65 determines whether the final bit of parity #2 is input (Step S35). When the final bit of parity #2 is not input (No in Step S35), the process returns to Step S34 and one bit of the next-order parity #2 is input. When the final bit of parity #2 is input (Yes in Step S35), the process ends.

According to the above-mentioned syndrome calculation, in the second-stage error correction process, when the input of parity #2 ends, the result obtained by substituting $\alpha^i$ into the polynomial in which "data and parity #1" are carried by a digit corresponding to the order of parity #2 (bit position shifts to the high-order) is stored in registers 64-1 and 64-2 which store the syndrome of group #1. The result obtained by substituting $\alpha^i$ into the polynomial in which "data, parity #1, and parity #2" are arranged is stored in registers 64-3 and 64-4 which store the syndrome of group #1.

In this case, since the order of the polynomial input to group #1 is aligned with the order of the polynomial input to group #2, the position of the lowest order of parity #2 in "data, parity #1, and parity #2" can be treated as the zeroth bit of "data, parity #1, and parity #2". Therefore, when there are general $t_2$-tuple error locator polynomial calculation circuits (which can perform an error correction process up to $t_2$ bits) and error location calculation circuits (Chien search circuits), it is possible to perform the second-stage error correction process.

In this embodiment, the two-stage error correction method is used. However, when an n-stage (n is an integer equal to or greater than 3) error correction method is used, group #1 to group #n may be provided and syndrome $S_i$ calculation circuits corresponding to the root of a generator polynomial $G_1(x)$ to the root of a generator polynomial $G_n(x)$ may be included in each of group #1 to group #n. In addition, each of group #2 to group #n may include the selector circuit and the control circuit, and the selector circuit may select input data while user data and a parity which corresponds to the root corresponding to the group including the selector are input and select 0 while a parity which does not correspond to the root corresponding to the group including the selector is input.

Next, the error locator polynomial calculation unit 262 and the Chien search unit 263 will be described. The error locator polynomial calculation unit 262 calculates the error locator polynomial on the basis of the syndrome calculated by the syndrome calculation unit 261. The error locator polynomial calculation unit 262 may have a structure capable of corresponding to a $t_2$-tuple error in order to correspond to a multi-stage error correction method. A Berlekamp-Massey algorithm, which is one of the error locator polynomial calculation algorithms, processes the number of loops corresponding to the maximum number of correction bits of the code. When this algorithm is used to stop the process at the number of loops corresponding to the $t_1$-tuple error in the first-stage error correction process in which the syndrome which is calculated using only "data and parity #1" as an input is used as an input, it is possible to end the process quickly.

The Chien search unit 263 is a circuit which calculates an error location on the basis of the error locator polynomial. When the Chien search unit 263 has a structure capable of corresponding to the $t_2$-tuple error, the following two control methods are considered.

The Chien search unit 263 sequentially calculates a value obtained by substituting an error locator into the error locator polynomial calculated by the error locator polynomial calculation unit 262, thereby calculating the location where the error locator is the root of the error locator polynomial. A code word, which is a combination of data and parities, is called a code polynomial in polynomial representation. In the code polynomial, the highest-order term corresponds to the first bit of data and the lowest-order term corresponds to the final bit of the parity. The control method is different when the error locator is substituted from the error locator indicating the highest order in the code polynomial and when the error locator is substituted from the error locator indicating the lowest order.

In the case in which the error locator is substituted from the error locator indicating the highest order in the code polynomial, the highest order of the code polynomial is different when the decoding target includes parity #2 (second-stage error correction process) or not (first-stage error correction process). Therefore, the value of the locator which is initially substituted into the Chien search circuit is changed. That is, a process is needed which changes the value initially substituted into the Chien search unit 263 depending on whether the decoding target includes parity #2 (whether the error correction process is the second-stage error correction process or the first-stage error correction process).

When the error locator is substituted from the error locator indicating the lowest order in the code polynomial, the error locator indicating the location of the lowest order in the code polynomial is the same when the decoding target includes parity #2 (second-stage error correction process) or not (first-stage error correction process). Therefore, it is not necessary to change the value which is initially substituted into the Chien search unit 263 described above.

In the case in which the error locator is substituted from the error locator indicating the highest order in the code polynomial and the case in which the error locator is substituted from the error locator indicating the lowest order, the direction in which the location of the substituted error locator shifts is different, that is, the shift direction is the direction in which the order decreases in the former case and is the direction in which the order increases in the latter case. However, a process of shifting the location of the substituted error locator and checking whether the root of the error locator polynomial is obtained is the same in the two cases.

It is assumed that the syndrome $S_i$ calculation circuit belonging to group #1 does not include an input data switching mechanism (the selector circuits 61-1 and 61-2 and the control circuit 65). In this case, parity #2 is also input to the syndrome $S_i$ calculation circuit belonging to group #1. The generator polynomial $G_i(x)$ of parity #1 has the roots ($\alpha^1$ and $\alpha^3$ in FIG. 23) corresponding to group #1, but does not have the roots of the generator polynomial $G_2(x)$. Therefore, when parity #2 is input to the syndrome $S_i$ calculation circuit belonging to group #1, it is difficult to exclude the contribution of the code word from the syndrome and it is very difficult to calculate the error locator polynomial (the syndrome needs to be determined depending on only the error pattern in order to effectively calculate the error locator polynomial). Therefore, it is difficult to perform error correction with the general error locator polynomial calculation circuit and the Chien search circuit.

When the input of data to the syndrome $S_i$ calculation circuit in group #1 is stopped at the time when "data and parity #1" are input, the order of the input polynomial is different in group #1 and group #2. Therefore, a value indicating the error location is not determined and it is difficult to define the error locator. As a result, the error locator polynomial may not be defined and it is difficult to perform error correction with the general error locator polynomial calculation circuit and the Chien search circuit.

In each stage of decoding, control is performed such that the operation of the unit that calculates the syndrome corresponding to the root of the generator polynomial used to generate the parity which is not used for decoding is stopped. In this way, even when the syndrome calculation unit 261 is shared by the error correction processes in each stage, it is possible to reduce power consumption to the same extent as that when the number of circuits required for error correction in each stage is the minimum.

In the parity error correction process using the external parity which protects parity #2, a decoding circuit may be provided separately from the decoding circuit for the error correction process using parity #1 and parity #2, or the decoding circuit may be shared.

Specifically, when the correction capability of the external parity which protects parity #2 is set to $t_2$ bits or less and a circuit for $t_2$-tuple error correction is provided, the circuits may be shared by the error correction process using the external parity. In particular, when the generator polynomial $G_1(x)$ is used as an external parity generator polynomial and a code length is equal to that of the first-stage code word (user data+parity #1), it is possible to perform decoding with the process which is exactly the same as the user data error correction process using the first-stage parity #1. Therefore, it is possible to simplify a control process.

Figure 26:
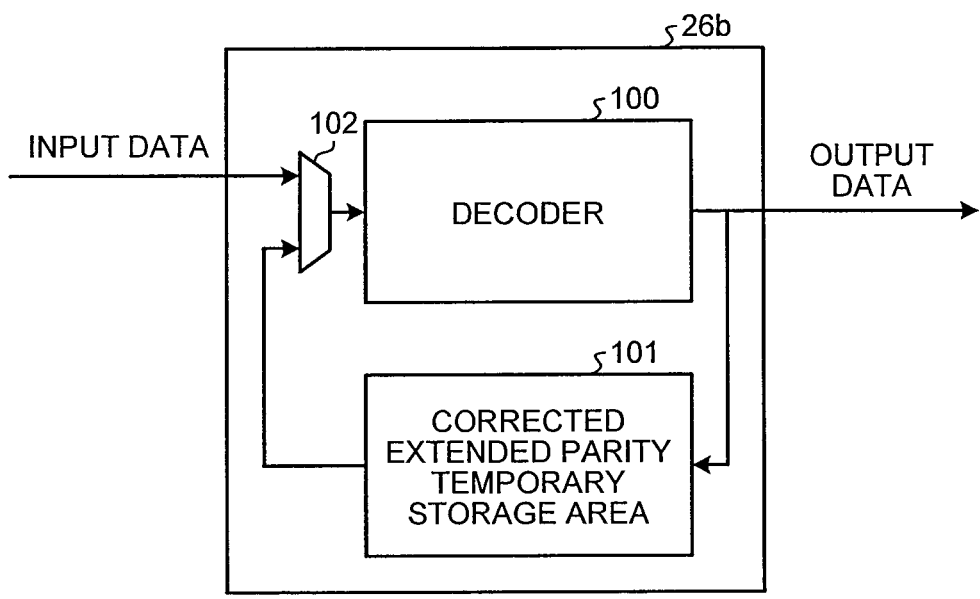
FIG. 26 is a diagram illustrating an example of the structure of a decoding unit when decoding is performed using an external parity.

FIG. 26 is a diagram illustrating an example of the structure of the decoding unit 26b when decoding is performed using the external parity. A decoder 100 illustrated in FIG. 26 includes the syndrome calculation unit 261, the error locator polynomial calculation unit 262, the Chien search unit 263, and the decoding control unit 264 illustrated in FIG. 21. As illustrated in FIG. 26, when the decoding unit 26b is also used for decoding using the external parity, it further includes a corrected extended parity temporary storage area 101 and a selector circuit 102.

The selector circuit 102 selects input data under the control of the control unit 23 or the decoding control unit 264 and inputs the input data to the decoder 100 in the first-stage error correction process using parity #1. When the first-stage error correction process fails, the selector circuit 102 selects input data under the control of the control unit 23 or the decoding control unit 264 and inputs the input data to the decoder 100. At that time, as the input data, parity #2 and the external parity are input. After the process of correcting the error of parity #2 using the external parity, the error-corrected parity #2 is temporarily stored in the corrected extended parity temporary storage area 101.

Then, when the second-stage error correction process is performed for user data, the selector circuit 102 selects input data (user data and parity #1) first under the control of the control unit 23 or the decoding control unit 264. When the input of the user data and parity #1 ends, the selector circuit 102 selects the data (error-corrected parity #2) stored in the corrected extended parity temporary storage area 101 and inputs the selected data to the decoder 100.

As described above, in this embodiment, when error correction coding is performed in two stages, the decoding unit 26b corresponding to correction capability when both parity #1 and parity #2 are used is provided and the syndrome $S_i$ calculation circuits are classified into groups in each stage such that the syndrome $S_i$ calculation circuits for calculating the syndrome corresponding to the root of the generator polynomial in the same stage form the same group. In the second-stage error correction process, instead of parity #2, 0 is input to the syndrome $S_i$ calculation circuits belonging to the group corresponding to the first stage. Therefore, the circuits can be shared by the first-stage error correction process and the second-stage error correction process and it is possible to exactly define the error location.

Sixth Embodiment

Figure 27:
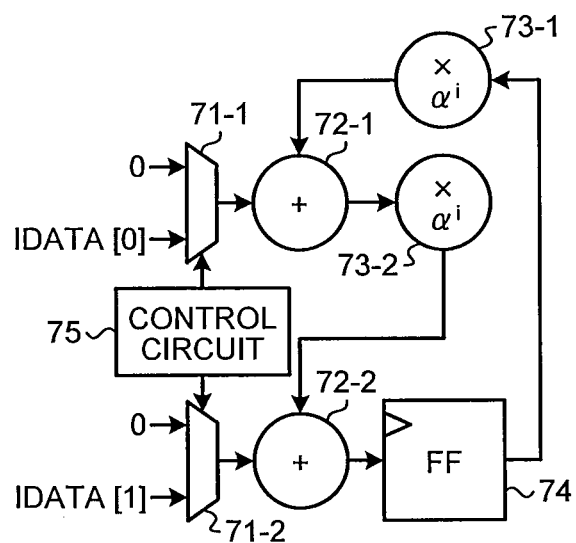
FIG. 27 is a block diagram illustrating an example of the structure of a syndrome $S_i$ calculation circuit of a syndrome calculation unit in a semiconductor memory device according to a sixth embodiment.

FIG. 27 is a block diagram illustrating an example of the structure of a syndrome $S_i$ calculation circuit of a syndrome calculation unit 261a in a semiconductor memory device according to a sixth embodiment. The structure of the semiconductor memory device according to this embodiment is the same as that of the semiconductor memory device according to the fifth embodiment except that a syndrome calculation unit 261a according to this embodiment replaces the syndrome calculation unit 261 according to the fifth embodiment. Hereinafter, the difference from the fifth embodiment will be described.

In the first embodiment, one bit of data is input to the syndrome calculation unit 261. However, in this embodiment, an example in which the syndrome calculation unit 261a performs P-bit (P is an integer equal to or greater than 2) parallel processing will be described. It is assumed that a coding operation according to this embodiment is performed by a two-stage error correction method, similarly to the fifth embodiment. FIG. 27 illustrates an example of the structure of the syndrome $S_i$ calculation circuit in group #1 when P is 2. The syndrome $S_i$ calculation circuit in group #1 includes selector circuits 71-1 and 71-2, XOR circuits 72-1 and 72-2, multipliers 73-1 and 73-2 which multiply $\alpha^i$, a register 74, and a control circuit 75. When P is equal to or greater than 3, similarly, each syndrome $S_i$ calculation circuit may include P multipliers and P XOR circuits and the syndrome $S_i$ calculation circuit in group #1 may include P selector circuits and the control circuit 75.

Similarly to the fifth embodiment, the syndrome calculation unit 261a according to this embodiment also includes a syndrome $S_i$ calculation circuit in group #2. The syndrome $S_i$ calculation circuit in group #2 has the same structure as the syndrome $S_i$ calculation circuit according to the related art which performs P-bit parallel processing. That is, since the syndrome $S_i$ calculation circuit in group #2 is the same as the syndrome $S_i$ calculation circuit illustrated in FIG. 27 except that the selector circuits 71-1 and 71-2 and the control circuit 75 are removed, it is not illustrated.

The selector circuits 71-1 and 71-2 of the syndrome $S_i$ calculation circuit in group #1 select input data (user data and parity) or 0 and output it to the XOR circuits 72-1 and 72-2 under the control of the control circuit 75. Specifically, the control circuit 75 controls the selector circuits 71-1 and 71-2 such that input data is selected while user data and parity #1 are input and 0 is selected while parity #2 is input. The control circuit 75 may be shared by a plurality of syndrome $S_i$ calculation circuits, similarly to the control circuit 65 according to the fifth embodiment.

When parallel processing is performed, P-bit input data is input to the syndrome $S_i$ calculation circuit in one cycle. FIG. 27 illustrates an example in which P is 2 and a zeroth bit and a first bit (IDATA[0] and IDATA[1] in FIG. 27) of the input data are input at the same time. The operation of the parallel processing is the same as that of general parallel processing except for the switching of data between input data and 0 by the selector circuits 71-1 and 71-2. That is, the update value REG_update of the register 74 in one cycle during P-bit parallel processing is represented by the following Expression 3:

$$\text{REG\_update} = CUR \times (\alpha^i)^P + IDATA[0] \times (\alpha^i)^{P-1} + IDATA[1] \times (\alpha^i)^{P-2} \ldots + IDATA[P-2] \times (\alpha^i)^1 + IDATA[P-1] \times (\alpha^i)^0 \quad (3)$$

where CUR is the value of the register 74 before update.

A syndrome calculation process according to this embodiment is the same as that according to the fifth embodiment except that, instead of one bit, P bits are input in Step S31 and Step S34 of the process illustrated in FIG. 25.

As described above, during parallel processing in the calculation of the syndrome, when the number of bits of parity #1 and parity #2 is not a multiple of the number P of parallel bits, a cycle in which input data is less than P bits is generated. It is assumed that the user data is a multiple of P bits (even when the user data is not a multiple of P bits, data, such as 0, is added such that the user data is a multiple of P bits). Each of parity #1 and parity #2 is a value which is determined by the maximum order of the generator polynomials $G_1(x)$ and $G_2(x)$ and is generated regardless of P.

When the cycle in which the input data is less than P bits is included, the process in the cycle is different from another P-bit parallel processing and it is necessary to prepare, for example, separate hardware. In this embodiment, during a coding operation, zero padding (zero insertion process) is performed such that the number of bits in each of parity #1 and parity #2 is a multiple of P so that it is not necessary to prepare separate hardware.

Figure 28:
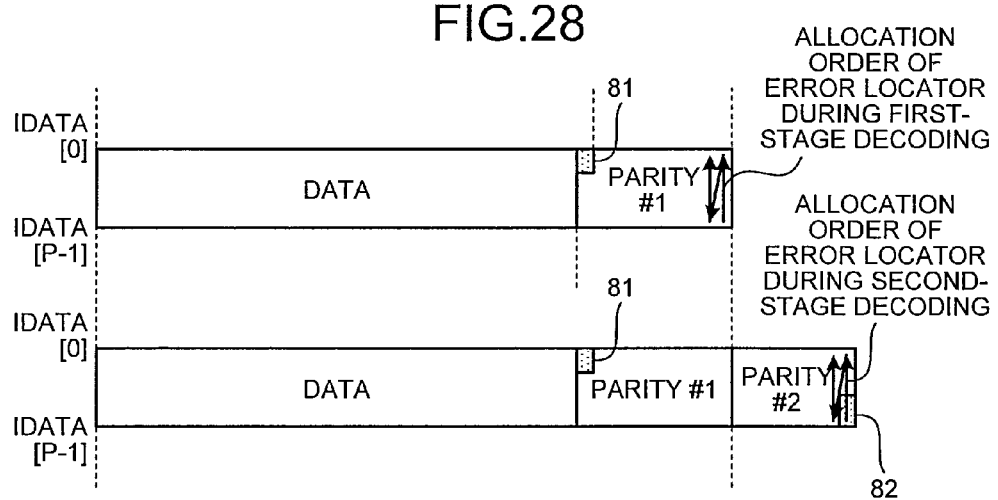
FIG. 28 is a diagram illustrating an example of a data format according to the sixth embodiment.

FIG. 28 is a diagram illustrating an example of a data format according to this embodiment. Here, the number of bits (the maximum order of the generator polynomial $G_1(x)$) of parity #1 is not an integer multiple of P bits. In this embodiment, when roundup (the number of bits of parity #1/P)×P−the number of bits of parity #1=$d_1$ is established, $d_1$-bit zero padding is performed for a position 81 illustrated in FIG. 28. A $d_1$-bit zero is input as lower $d_1$ bits of the information polynomial in the calculation of parity #1 by the coding unit 25.

For parity #2, similarly, when roundup (the number of bits of parity #2/P)×P−the number of bits of parity #2=$d_2$ is established, $d_2$-bit zero padding is performed for a position 82 illustrated in FIG. 28. A $d_2$-bit zero is not input in the calculation of the parity by the coding unit 25, but is added after parity #2 is generated.

In this way, as illustrated in FIG. 28, it is possible to prevent the generation of the cycle in which the number of bits of parity #1 and parity #2 is a multiple of P and input data is less than P bits in the calculation of the syndrome. Therefore, it is not necessary to perform an extra process, as compared to a case in which it is necessary to respond to the cycle in which input data is less than P bits. As a result, it is possible to reduce a circuit size.

When the number of bits of parity #1 is not a multiple of P, invalid data is included in parity #1 and parity #2 in the second-stage error correction process. When P parallel Chien search circuits for checking whether an error occurs at P locations in each cycle are used, an error locator from which an invalid data portion is removed is allocated. In order to output the error location according to the format aligned with P bits, it is necessary to shift the portion and output the error location. As illustrated in FIG. 28, since $d_1$-bit zero padding is performed, this process is not needed and it is possible to reduce a circuit size.

Figure 29:
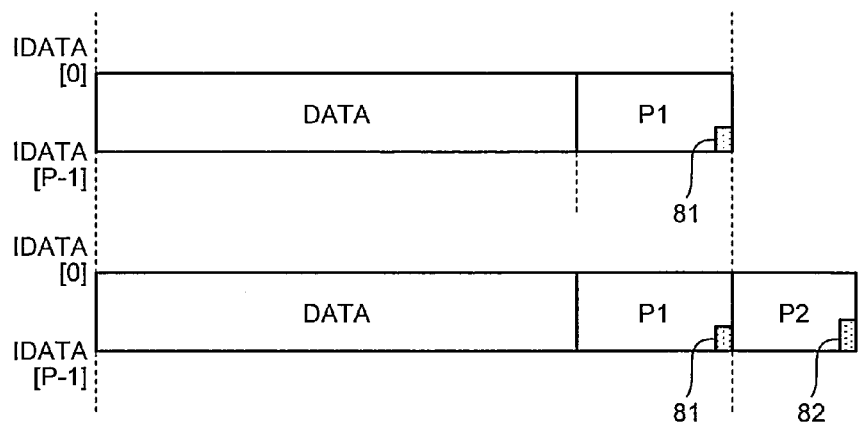
FIG. 29 is a diagram illustrating an example of the data format when a $d_1$-bit zero padding position is at the end of parity #1.

In addition, the $d_1$-bit zero may not be input to the generation process of parity #1 by the coding unit 25, but may be added after parity #1 is generated. In this case, the position 81 of the $d_1$-bit zero is at the end of parity #1. FIG. 29 is a diagram illustrating an example of the data format when the position 81 of the $d_1$-bit zero padding is at the end of parity #1. The position 81 is not at the beginning of parity #1, but is at the end of parity #1. Similarly, the $d_2$-bit zero may not be input to generation process of parity #2 by the coding unit 25, but may be added after parity #2 is generated. The position 82 of the $d_2$-bit zero is at the end of parity #2.

In this embodiment, it is assumed that both a process of inserting a zero to the calculation of the parity by the coding unit 25*b* such that the number of bits of the parity is a multiple of P and a process of generating a parity (the number of bits is not a multiple of P) using the coding unit 25*b* and inserting a zero such that the number of bits of the parity is a multiple of P are called zero padding.

Figure 30:
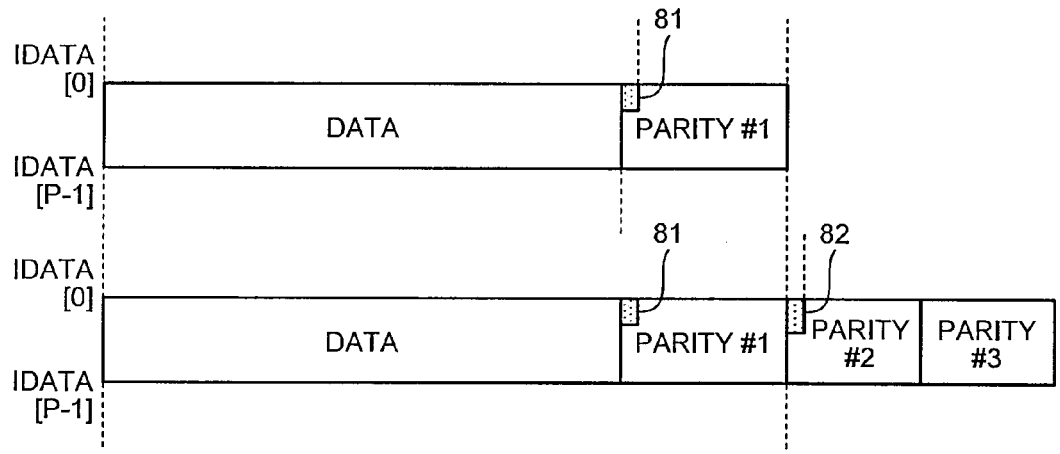
FIG. 30 is a diagram illustrating an example of the data format when a three-stage error correction method is used.

FIG. 30 is a diagram illustrating an example of the data format when a three-stage error correction method is used. The $d_1$-bit zero is padded to the position 81 of a start portion of parity #1 and the $d_2$-bit zero is padded to the position 82 of a start portion of parity #2. Specifically, in the example illustrated in FIG. 30, similarly to the example illustrated in FIG. 28, the $d_1$-bit zero is input as the lower bit of the information polynomial when parity #1 is generated. In addition, the $d_2$-bit zero is input as the lower bit of the information polynomial (the lower bit of parity #1) when parity #2 is generated. Here, the number of bits of parity #3 is a multiple of P and zero padding is not performed. However, when the number of bits of parity #3 is not a multiple of P, roundup (the number of bits of parity #3/P)×P−the number of bits of parity #3=$d_3$ bits are added to the beginning or end of parity #3 after parity #3 is generated. In addition, the $d_1$-bit zero and the $d_2$-bit zero may not be input when parity #1 and parity #2 are each generated, but may be added after parity #1 and parity #2 are generated. In this case, the position 81 and the position 82 are at the ends of parity #1 and parity #2.

Figure 31:
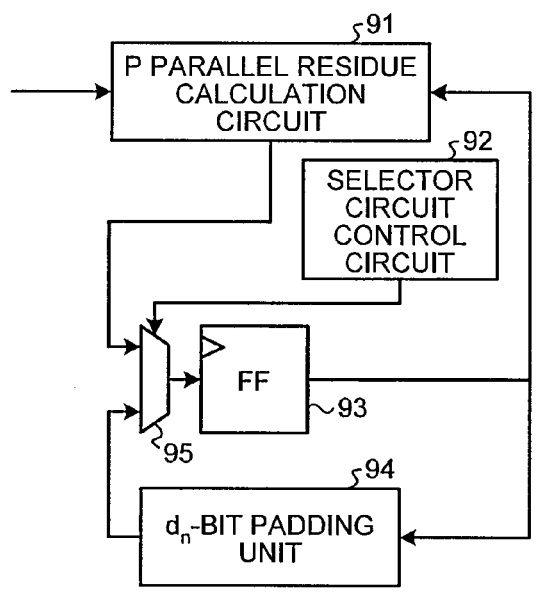
FIG. 31 is a diagram illustrating an example of the structure of a coding unit for generating parity #n corresponding to P-bit parallel processing during decoding.

FIG. 31 is a diagram illustrating an example of the structure of the coding unit 25 for generating parity #n corresponding to P-bit parallel processing when decoding is performed by an n-stage error correction method. FIG. 31 illustrates an example of the structure when $d_n$ bits ($d_n$=roundup (the number of bits of parity #n/P)×P−the number of bits of parity #n is input as the lower bit of the information polynomial during the generation of parity #n. The coding unit 25 illustrated in FIG. 31 includes a P parallel residue calculation circuit 91 which calculates a residue of input data using the generator polynomial $G_n(x)$, a register (FF) 93 which stores the intermediate calculation result of parity #n, a selector circuit 95 which switches an input to the register 93, a selector circuit control circuit 92 which controls the switching of the selector circuit 95, and a $d_n$-bit padding unit 94 which calculates a residue of a $d_n$-bit zero using the generator polynomial $G_n(x)$.

Input data (information bit) to the P parallel residue calculation circuit 91 (that is, to the coding unit 25) is user data+ parity #1+ . . . +parity #(n−1) (however, when parity #1 is calculated, the input data is only user data). While data is input to the coding unit 25, the selector circuit control circuit 92 controls the selector circuit 95 such that the output of the P parallel residue calculation circuit 91 obtained by $G_n(x)$ is input to the register 93. When the input is completed, the selector circuit control circuit 92 controls the selector circuit 95 such that the output of the $d_n$-bit padding unit 94 is input to the register 93.

The $d_n$-bit padding unit 94 includes, for example, a $d_n'$ ($d_n'$ is a divisor of $d_n$) parallel residue calculation circuit using $G_n(x)$. When an input is fixed to zero and the register 93 is updated by the output of the circuit in a $d_n \mp d_n'$ cycle, the coding process is completed and it is possible to output parity #n.

The description of a case using the external parity has not been provided. However, when another circuit is used for the process of decoding parity #i (i=1, 2, . . . , n) using the external parity, the process of decoding parity #i using the external parity is the same as the general decoding process. As described in the first embodiment, when the circuit is shared by the process of decoding parity #i using the external parity and the process of decoding user data using, for example, parity #1, the P parallel processing is also performed for the process of decoding parity #i using the external parity. Therefore, when the number of bits of the external parity is not a multiple of P, it is preferable to perform zero padding such that the number of bits is a multiple of P.

As described above, in this embodiment, during P-bit parallel processing in the decoding operation, when the number of bits of the parity in each stage is not a multiple of P in the coding operation, zero padding is performed such that the number of bits of the parity in each stage is a multiple of P. Therefore, during decoding, it is not necessary to perform an extra process caused by the parity with bits which are not a multiple of P. Therefore, it is possible to reduce a circuit size.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a non-volatile memory, comprising:
    a coding unit that performs an error correction coding process for user data to generate first to n-th parities and performs the error correction coding process for each of the first to n-th parities to generate first to n-th external parities;
    a memory interface unit that controls writing and reading of the user data, the first to n-th parities, and the first to n-th external parities to and from the non-volatile memory; and
    a decoding unit that performs the error correction decoding process using the user data, the first to n-th parities, and the first to n-th external parities read from the non-volatile memory,
    wherein a generator polynomial used to generate the i-th parity (i is an integer equal to or greater than 1 and equal to or less than n) is selected based on a generator polynomial used to generate the first to (i−1)-th parities.

2. The memory controller according to claim 1,
wherein the decoding unit performs the error correction decoding process for the first to k-th parities (k is an integer equal to or greater than 1 and equal to or less than n) using the first to k-th external parities and then performs the error correction decoding process for the user data using the first to k-th parities.

3. A memory controller that controls a non-volatile memory, comprising:
a coding unit that performs an error correction coding process for user data to generate a first parity, performs the error correction coding process for the user data and the first parity to generate a second parity, performs the error correction coding process for the user data and the first parity to generate an n-th parity, and performs the error correction coding process for each of the second to n-th parities to generate second to n-th external parities;
a memory interface unit that controls writing and reading of the user data, the first to n-th parities, and the second to n-th external parities to and from the non-volatile memory; and
a decoding unit that performs an error correction decoding process using the user data, the first to n-th parities, and the second to n-th external parities read from the non-volatile memory,
wherein a generator polynomial used to generate the i-th parity (i is an integer equal to or greater than 1 and equal to or less than n) is selected based on a generator polynomial used to generate the first to (i−1)-th parities.

4. The memory controller according to claim 3,
wherein, when the error correction decoding process for the user data cannot be performed with the error correction capability of the first parity, the decoding unit performs the error correction decoding process for the second to k-th parities (k is an integer equal to or greater than 2 and equal to or less than n) using the second to k-th external parities and performs error correction for the user data and the first parity using the second to k-th parities.

5. The memory controller according to claim 1,
wherein a generator polynomial $G_i(x)$ used to generate the i-th parity (i is an integer equal to or greater than 1 and equal to or less than n) is selected such that $r_1, r_2, \ldots,$ and $r_n$ satisfy the following relation:

$$r_2 \leq r_1, r_1 + 2t_1 - 1 \leq r_2 + 2t_2 - 1$$
$$r_3 \leq r_2, r_2 + 2t_2 - 1 \leq r_3 + 2t_3 - 1$$
$$\ldots$$
$$r_n \leq r_{n-1}, r_{n-1} + 2t_{n-1} - 1 \leq r_n + 2t_n - 1$$

where $r_i$ and $t_i$ are integers, and
$G_1(x) \times G_2(x) \times \ldots \times G_i(x) = 0$ has $2 \times t_i$ roots, that is $\alpha^{r_i}, \alpha^{r_i+1}, \alpha^{r_i+2}, \ldots, \alpha^{2t_i+r_i-2}, \alpha^{2t_i+r_i-1}$.

6. The memory controller according to claim 3,
wherein a generator polynomial $G_i(x)$ used to generate the i-th parity (i is an integer equal to or greater than 1 and equal to or less than n) is selected such that $r_1, r_2, \ldots,$ and $r_n$ satisfy the following relation:

$$r_2 \leq r_1, r_1 + 2t_1 - 1 \leq r_2 + 2t_2 - 1$$
$$r_3 \leq r_2, r_2 + 2t_2 - 1 \leq r_3 + 2t_3 - 1$$
$$\ldots$$
$$r_n \leq r_{n-1}, r_{n-1} + 2t_{n-1} - 1 \leq r_n + 2t_n - 1$$

where $r_i$ and $t_i$ are integers, and
$G_1(x) \times G_2(x) \times \ldots \times G_i(x) = 0$ has $2 \times t_i$ roots, that is $\alpha^{r_i}, \alpha^{r_i+1}, \alpha^{r_i+2}, \ldots, \alpha^{2t_i+r_i-2}, \alpha^{2t_i+r_i-1}$.

7. The memory controller according to claim 1,
wherein the same error correcting code is used in the error correction coding process for generating the first to n-th parities.

8. The memory controller according to claim 3,
wherein the same error correcting code is used in the error correction coding process for generating the first to n-th parities.

9. The memory controller according to claim 7,
wherein the error correcting code is a BCH code.

10. The memory controller according to claim 8,
wherein the error correcting code is a BCH code.

11. The memory controller according to claim 1,
wherein at least some of the parities and the external parities are stored in a page only for parity which stores the parities and is different from that storing the user data.

12. The memory controller according to claim 1,
wherein at least some of the parities and the external parities are stored in the user data, which is a parity protection target, or a user data page which is different from a page storing the parity.

13. A memory controller that controls a non-volatile memory, comprising:
a coding unit that performs an error correction coding process for a first user data item to generate a first parity, performs the error correction coding process for the first user data item and the first parity to generate a second parity, and performs the error correction coding process for a second user data item and a plurality of parities including the second parity to generate a third parity;
a memory interface unit that controls writing of the first user data item and the first parity to a first page and writing of the second user data item, the plurality of parities including the second parity, and a third parity to a second page; and
a decoding unit that performs an error correction decoding process based on the first and second user data items and the first to third parities read from the non-volatile memory,
wherein a generator polynomial used to generate the second parity is selected based on a generator polynomial used to generate the first parity.

14. The memory controller according to claim 13,
wherein the size of the first parity is equal to or greater than the sum of the size of the second parity and the size of the third parity.

15. The memory controller according to claim 13,
wherein the error correction coding process is a BCH coding process.

16. The memory controller according to claim 13,
wherein a generator polynomial $G_i(x)$ used to generate a i-th parity (i is an integer equal to or greater than 1 and equal to or less than n) is selected such that $r_1$, $t_1$, $r_2$, $t_2$, $r_3$, and $t_3$ satisfy the following relation:

$r_2 \leq r_1$, $r_1+2t_1-1 \leq r_2+2t_2-1$
$r_3 \leq r_2$, $r_2+2t_2-1 \leq r_3+2t_3-1$)

where $r_1$, $t_1$, $r_2$, $t_2$, $r_3$ and $t_3$ are integers, and $G_1(x) \times G_2(x) \times \ldots \times G_i(x)=0$ has $2 \times t_i$ roots, that is $\alpha^{ri}$, $\alpha^{ri+1}$, $\alpha^{ri+2}$, ..., $\alpha^{2ti+ri-2}$, $\alpha^{2ti+ri-1}$.

17. The memory controller according to claim 1,
wherein the decoding unit includes a syndrome calculation unit that can respond to an operation of $t_n$ bits or more if correction capability when all of the first to n-th parities are used is $t_n$ bits, the syndrome calculation unit includes $t_n$ or more syndrome calculation circuits that calculate a syndrome corresponding to each of the roots of the generator polynomials used to generate the first to n-th parities, when the generator polynomial used to generate the i-th parity is $G_i$, the syndrome calculation circuit corresponding to the root included in $G_1$ to $G_{n-1}$ includes a selection circuit that selects any one of the user data, at least one of the user data and the first to (n−1)-th parities, and 0, and when a process of correcting an error of the user data using the first to i-th parities and an i-th error correction process are performed, the syndrome calculation unit performs the first to n-th error correction processes.

18. The memory controller according to claim 17,
wherein, in the i-th error correction process, the operation of the syndrome calculation circuits other than the syndrome calculation circuit corresponding to the root included in $G_i$ is stopped.

19. The memory controller according to claim 17,
wherein, when the syndrome calculation circuit performs P-bit (P is an integer equal to or greater than 2) parallel processing and there is a parity with bits that are not a multiple of P among the first to n-th parities, the coding unit performs a zero padding process such that the number of bits of the parity is a multiple of P.

20. The memory controller according to claim 19,
wherein the zero padding process inputs zero to a process of generating the parity with bits that are not a multiple of P among the first to n-th parities such that the number of bits of the parity is a multiple of P.

* * * * *